(12) United States Patent
Hwang et al.

(10) Patent No.: US 11,637,019 B2
(45) Date of Patent: Apr. 25, 2023

(54) METHOD FOR FORMING A SEMICONDUCTOR DEVICE HAVING PROTRUSION STRUCTURES ON A SUBSTRATE AND A PLANARIZED CAPPING INSULATING LAYER ON THE PROTRUSION STRUCTURES

(71) Applicant: SAMSUNG ELECTRONICS CO., LTD., Suwon-si (KR)

(72) Inventors: Chang Sun Hwang, Hwaseong-si (KR); Han Sol Seok, Hwaseong-si (KR); Hyun Ku Kang, Hwaseong-si (KR); Byoung Ho Kwon, Hwaseong-si (KR); Chung Ki Min, Hwaseong-si (KR)

(73) Assignee: Samsung Electronics Co., Ltd.

( * ) Notice: Subject to any disclaimer, the term of this patent is extended or adjusted under 35 U.S.C. 154(b) by 38 days.

(21) Appl. No.: 17/393,201

(22) Filed: Aug. 3, 2021

(65) Prior Publication Data

US 2021/0366720 A1    Nov. 25, 2021

Related U.S. Application Data

(63) Continuation of application No. 16/433,218, filed on Jun. 6, 2019, now Pat. No. 11,087,990.

(30) Foreign Application Priority Data

Sep. 19, 2018 (KR) ........................ 10-2018-0112457

(51) Int. Cl.
*H01L 21/3105* (2006.01)
*H01L 25/065* (2023.01)
(Continued)

(52) U.S. Cl.
CPC .. *H01L 21/31053* (2013.01); *H01L 21/76229* (2013.01); *H01L 21/78* (2013.01);
(Continued)

(58) Field of Classification Search
CPC ......... H01L 21/31053; H01L 21/76229; H01L 27/11556; H01L 27/11582; H01L 27/11575; H01L 27/1157; H01L 21/6229
(Continued)

(56) References Cited

U.S. PATENT DOCUMENTS

| 5,851,899 A | 12/1998 | Weigand |
| 5,961,794 A | 10/1999 | Morita |

(Continued)

FOREIGN PATENT DOCUMENTS

| JP | 2002093898 A | 3/2002 |
| KR | 20080112526 A | 12/2008 |

*Primary Examiner* — Khiem D Nguyen
(74) *Attorney, Agent, or Firm* — Myers Bigel, P.A.

(57) ABSTRACT

A semiconductor device includes a stacked structure on a substrate. The stacked structure includes stepped regions and a central region between the stepped regions, an upper insulation layer on the stacked structure, and a capping insulation layer on the stepped regions of the stacked structure. The capping insulation layer includes a first upper end portion and a second upper end portion that are adjacent to the upper insulation layer. The upper insulation layer is between the first upper end portion and the second upper end portion. The first upper end portion and the second upper end portion extends a first height relative to the substrate that is different from a second height relative to the substrate of the second upper end portion.

20 Claims, 29 Drawing Sheets

(51) Int. Cl.
   *H01L 21/762*     (2006.01)
   *H01L 27/11582*   (2017.01)
   *H01L 29/06*      (2006.01)
   *H01L 27/11556*   (2017.01)
   *H01L 21/78*      (2006.01)

(52) U.S. Cl.
   CPC .... *H01L 25/0657* (2013.01); *H01L 27/11556* (2013.01); *H01L 27/11582* (2013.01); *H01L 29/0642* (2013.01)

(58) Field of Classification Search
   USPC ........................................ 257/314, 324, 328
   See application file for complete search history.

(56) References Cited

U.S. PATENT DOCUMENTS

| | | |
|---|---|---|
| 6,268,263 B1 | 7/2001 | Sakai et al. |
| 9,343,479 B2 | 5/2016 | Tanzawa |
| 9,673,213 B1 | 6/2017 | Yu et al. |
| 9,691,782 B1 | 6/2017 | Hwang et al. |
| 9,806,185 B2 | 10/2017 | Lee |
| 10,269,625 B1 | 4/2019 | Matovu et al. |
| 2008/0113512 A1 | 5/2008 | Kim |
| 2012/0108048 A1 | 5/2012 | Lim et al. |
| 2012/0168858 A1 | 7/2012 | Hong |
| 2014/0061776 A1 | 3/2014 | Kwon et al. |
| 2016/0111439 A1* | 4/2016 | Tsutsumi .......... H01L 27/11556 438/257 |
| 2016/0329101 A1 | 11/2016 | Sakakibara |
| 2017/0062461 A1 | 3/2017 | Takamatsu |
| 2017/0062469 A1* | 3/2017 | Tsiang ................ H01L 21/3115 |
| 2017/0256551 A1* | 9/2017 | Lee ..................... H01L 27/1157 |
| 2017/0287928 A1 | 10/2017 | Kanamori et al. |
| 2018/0083025 A1* | 3/2018 | Inatsu ................ H01L 21/31144 |
| 2018/0090512 A1* | 3/2018 | Kim .................. H01L 27/11575 |

* cited by examiner

METHOD FOR FORMING A SEMICONDUCTOR DEVICE HAVING PROTRUSION STRUCTURES ON A SUBSTRATE AND A PLANARIZED CAPPING INSULATING LAYER ON THE PROTRUSION STRUCTURES

CROSS-REFERENCE TO RELATED APPLICATION

This US non-provisional patent application is a continuation of U.S. patent application Ser. No. 16/433,218, filed Jun. 6, 2019, issued as U.S. Pat. No. 11,087,990, which itself claims benefit of priority under 35 U.S.C. § 119 to Korean Patent Application No. 10-2018-0112457 filed on Sep. 19, 2018 in the Korean Intellectual Property Office, the disclosure of which is incorporated herein by reference in its entirety.

BACKGROUND

The present disclosure relates to a semiconductor device, in particular, a planarization method of a capping insulation layer, a method for forming a semiconductor device using the same, and a semiconductor device formed thereby.

In order to improve the degree of integration of semiconductor devices, semiconductor devices including gates that are stacked while being spaced apart from each other in a direction perpendicular to an upper surface of the semiconductor substrates have been developed. As the number of stacked gates increases, unexpected failures may occur in the process, making it difficult to improve the productivity of the semiconductor devices.

SUMMARY

An aspect of the present inventive concept is to provide a method of forming a semiconductor device capable of improving the degree of planarization of a capping insulation layer surrounding a stacked structure.

An aspect of the present inventive concept is to provide a method capable of improving the degree of integration of a semiconductor device.

An aspect of the present inventive concept is to provide a method capable of improving productivity in the manufacturing of a semiconductor device.

Some embodiments of the present inventive concepts provide a semiconductor device. The semiconductor device includes a stacked structure on a substrate. The stacked structure includes stepped regions and a central region between the stepped regions, an upper insulation layer on the stacked structure, and a capping insulation layer on the stepped regions of the stacked structure. The capping insulation layer includes a first upper end portion and a second upper end portion that are adjacent to the upper insulation layer. The upper insulation layer is between the first upper end portion and the second upper end portion. The first upper end portion and the second upper end portion extends a first height relative to the substrate that is different from a second height relative to the substrate of the second upper end portion.

According to some embodiments of the present inventive concepts, a semiconductor device is provided. The semiconductor device includes stacked structures on a substrate, and spaced apart from each other. Each of the stacked structures include a central region and a stepped region surrounding the central region, upper insulation layers on the stacked structures, and a capping insulation layer surrounding the upper insulation layers. The capping insulation layers is on the stepped regions of the stacked structures and between the stacked structures. The capping insulation layer includes upper end portions adjacent to the upper insulation layers and having different heights relative to the substrate.

According to some embodiments of the present inventive concepts, a semiconductor device is provided. The semiconductor device includes separation structures on a substrate, a protrusion structure between the separation structures. The protrusion structure includes a stacked structure and an upper insulation layer on the stacked structure. The stacked structure includes stepped regions and a central region between the stepped regions, and a capping insulation layer on the stepped regions and adjacent to the upper insulation layer. The capping insulation layer comprises a first upper end portion and a second upper end portion that are adjacent to the upper insulation layer and have different heights relative to the substrate.

According to some embodiments of the present inventive concept, a method for forming a semiconductor device is provided. The method includes forming protrusion structures on a substrate, wherein each of the protrusion structures includes a molded structure, an upper insulation layer on the molded structure, and a planarization stop layer on the upper insulation layer, forming a capping insulation layer on the substrate having the protrusion structures; forming a mask pattern having openings on the capping insulation layer, wherein the openings overlap the protrusion structures, etching the capping insulation layer exposed by the openings; removing the mask pattern after etching the capping insulation layer, after the mask pattern is removed, a first planarization process for first planarizing the capping insulation layer is performed; after the first planarization process, a second planarization process for second planarizing the capping insulation layer is performed to form a planarized capping insulation layer; and removing the planarization stop layers of the protrusion structures to expose the upper insulation layers. The planarized capping insulation layer has upper end portions adjacent to the planarization stop layers, the upper end portions includes first and second upper end portions positioned on different height levels.

According to some embodiments of the present inventive concept, a method for forming a semiconductor device is provided. The method includes forming protrusion structures on a substrate, wherein each of the protrusion structures includes a molded structure including a central region and a stepped region surrounding the central region, an upper insulation layer on the central region of the molded structure, and a planarization stop layer on the upper insulation layer, forming a capping insulation layer on the substrate having the protrusion structures, forming a mask pattern having openings on the capping insulation layer, wherein the openings overlap the central regions of the protrusion structures, etching the capping insulation layer exposed by the openings, removing the mask pattern after etching the capping insulation layer, after the mask pattern is removed, performing a first planarization process for first planarizing the capping insulation layer; after the first planarization process, performing a second planarization process for second planarizing the capping insulation layer to form a planarized capping insulation layer, and removing the planarization stop layers of the protrusion structures to expose the upper insulation layers. The openings have a smaller size than the planarization stop layers of the protrusion structures, the openings include openings having different widths or sizes from each other.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list. Hereinafter, example embodiments of the present inventive concepts will be described with reference to the accompanying drawings.

Figure 1A:
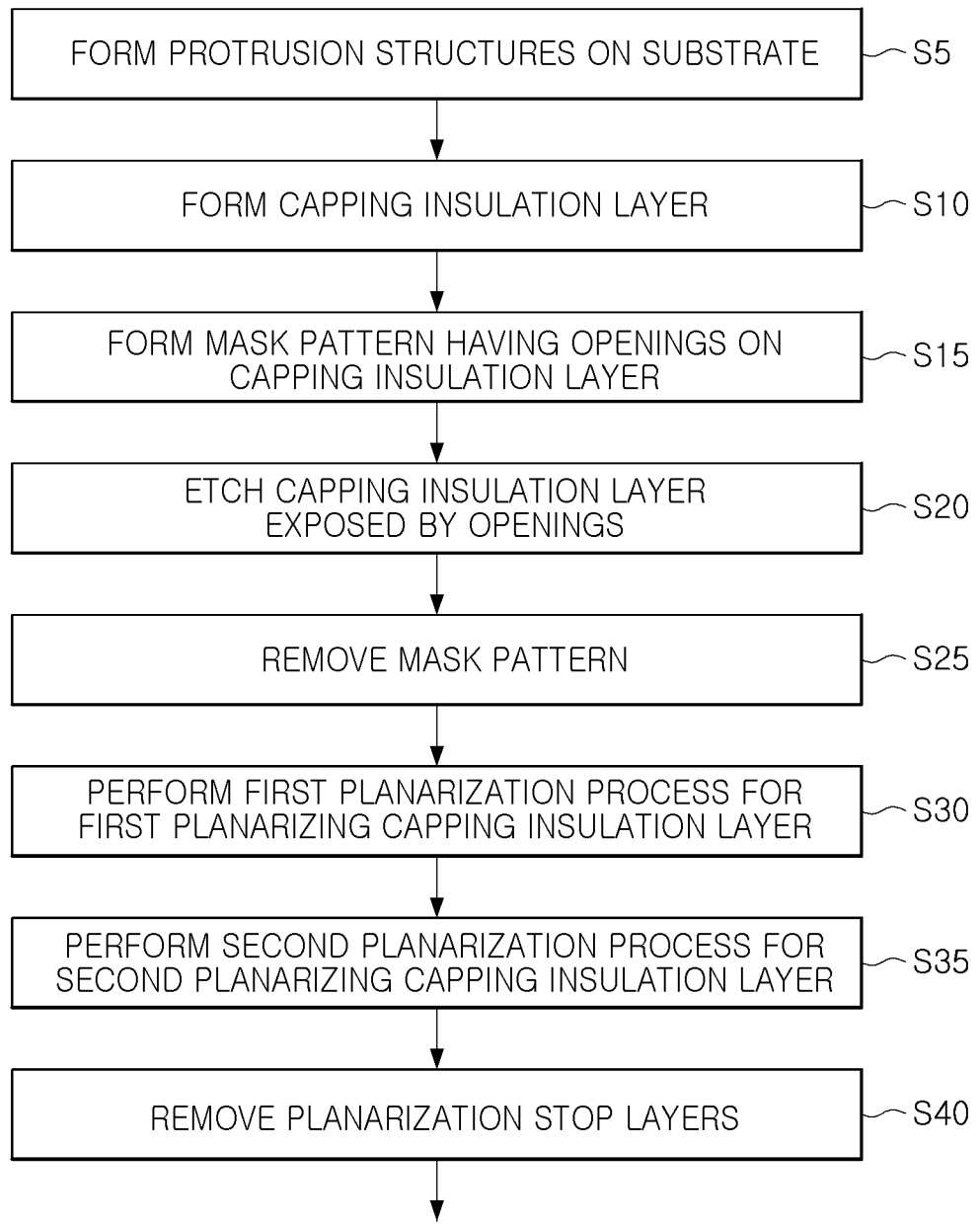
FIGS. 1A and 1B are flowcharts illustrating a method of forming a semiconductor device according to some embodiments of the present inventive concepts.
Figure 1B:
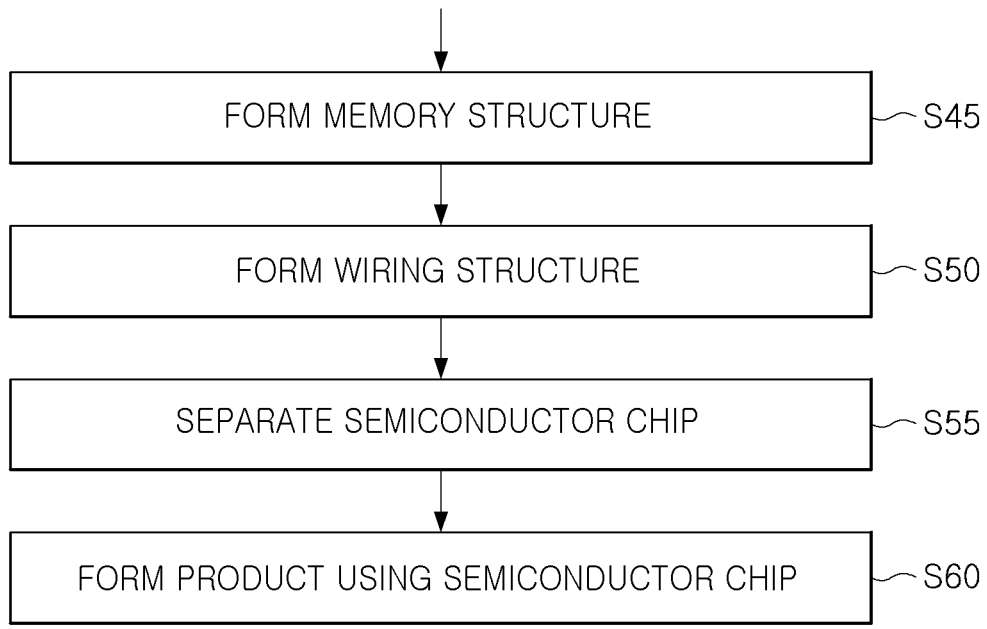
Figure 2:
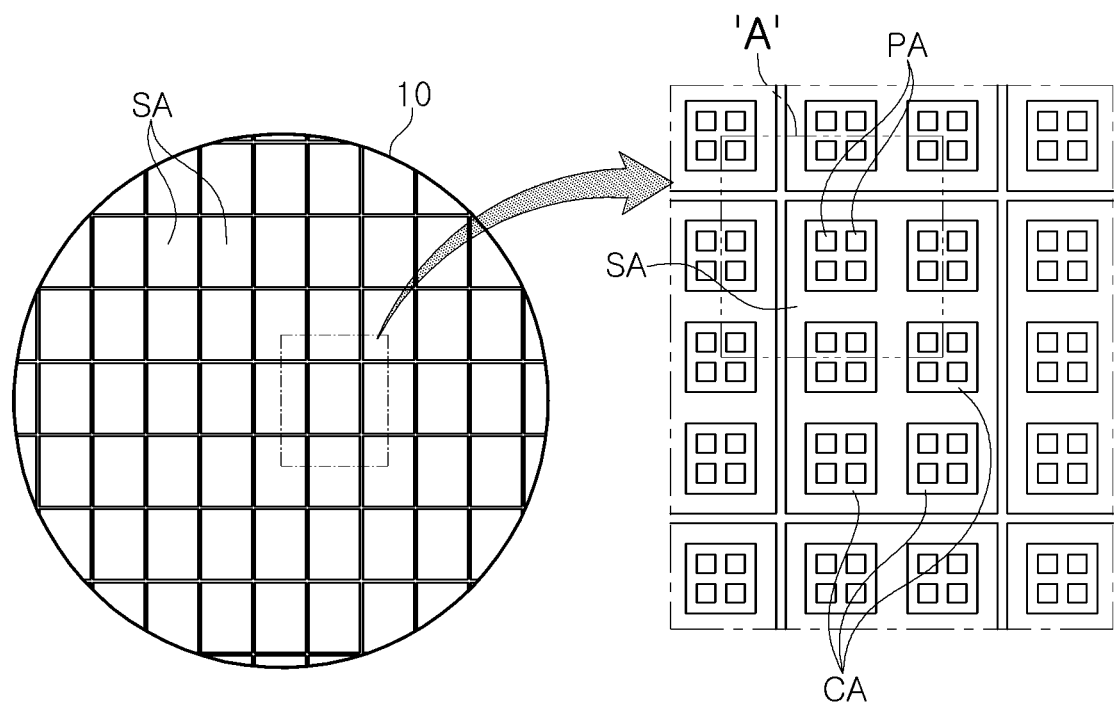
FIG. 2 is a plan view illustrating a method of forming a semiconductor device according to some embodiments of the present inventive concepts.
Figure 3:
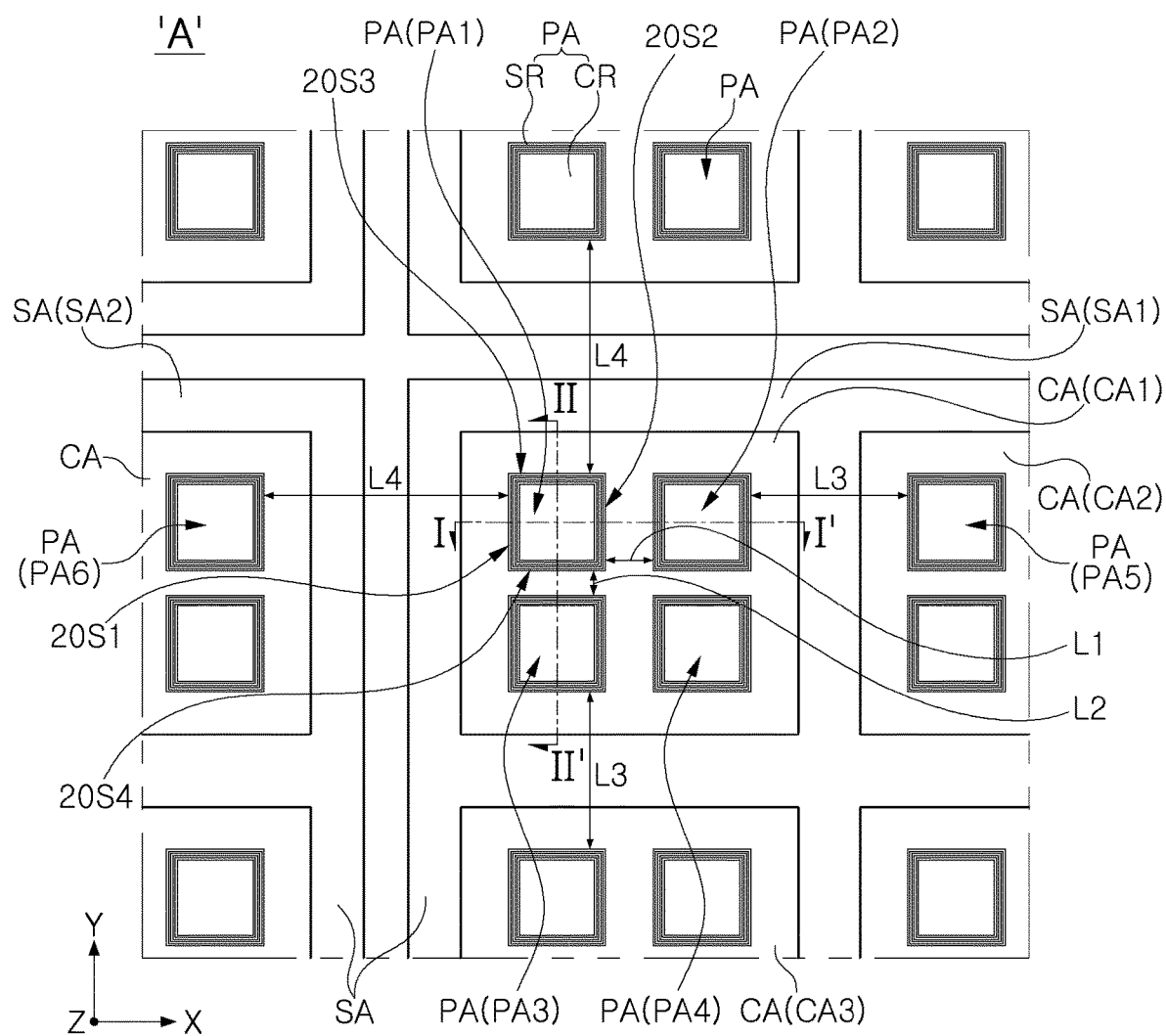
FIG. 3 is a partially enlarged view of a portion of FIG. 2.
Figure 4A:
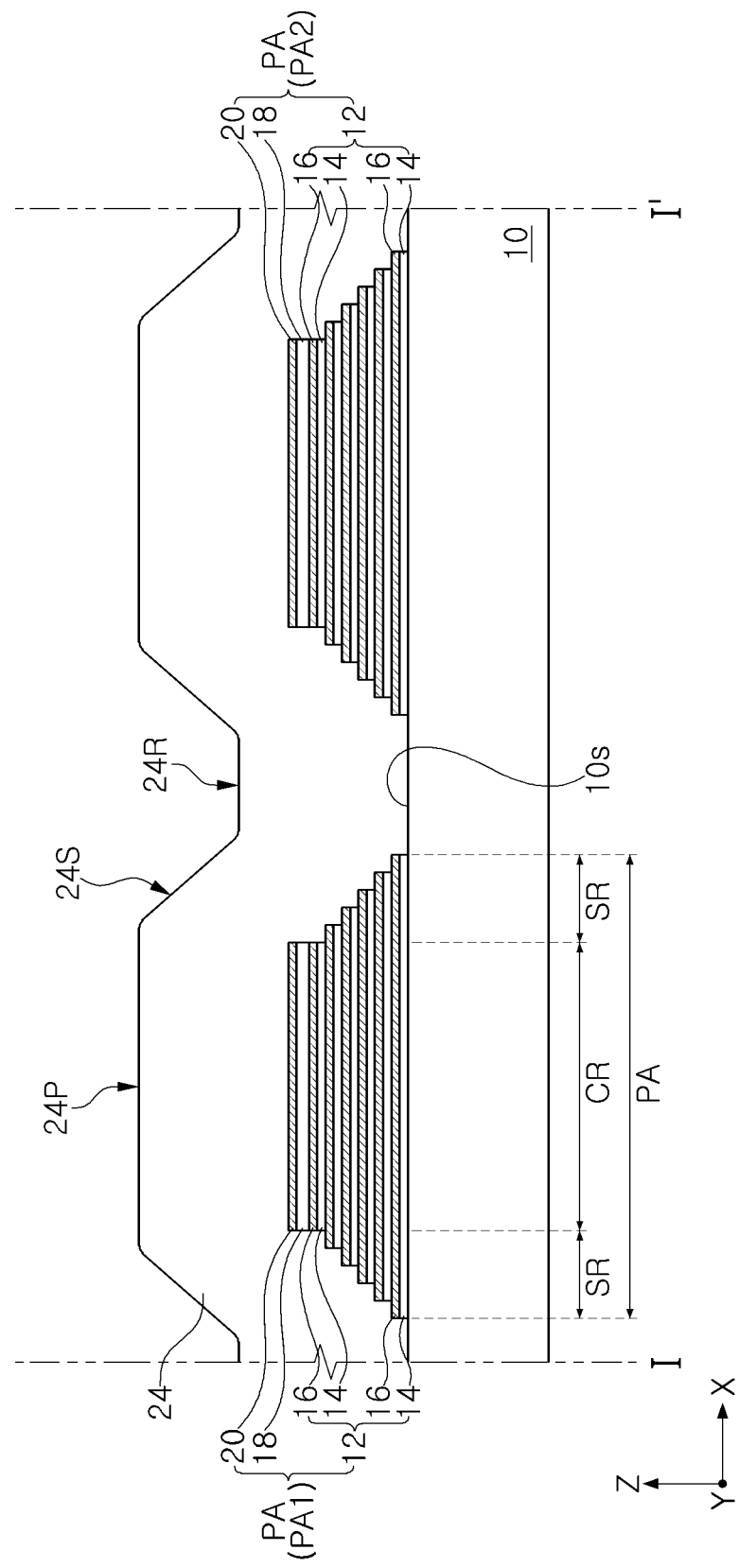
FIGS. 4A to 15B are views illustrating methods of forming a semiconductor device according to some embodiments of the present inventive concepts.
Figure 4B:
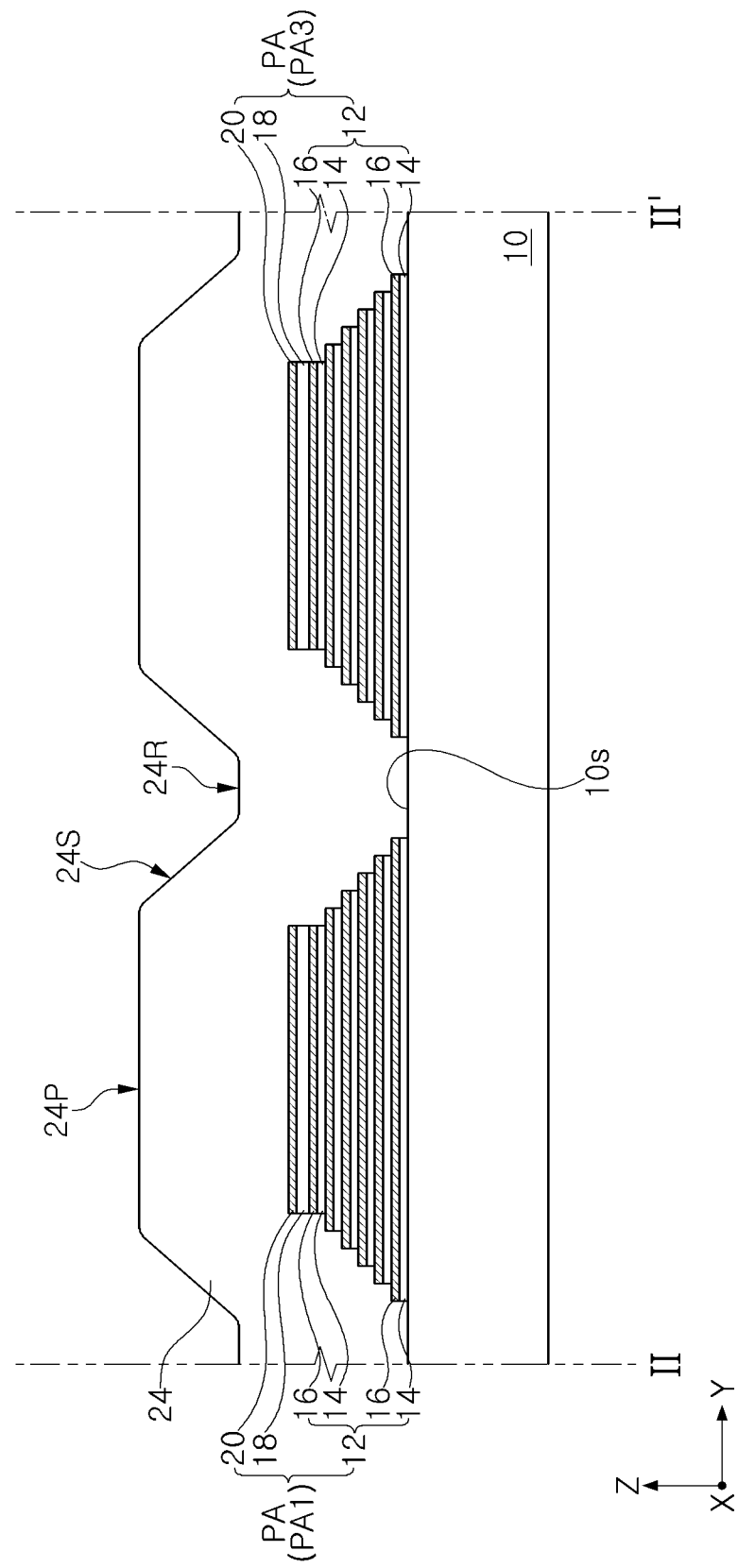
Figure 5A:
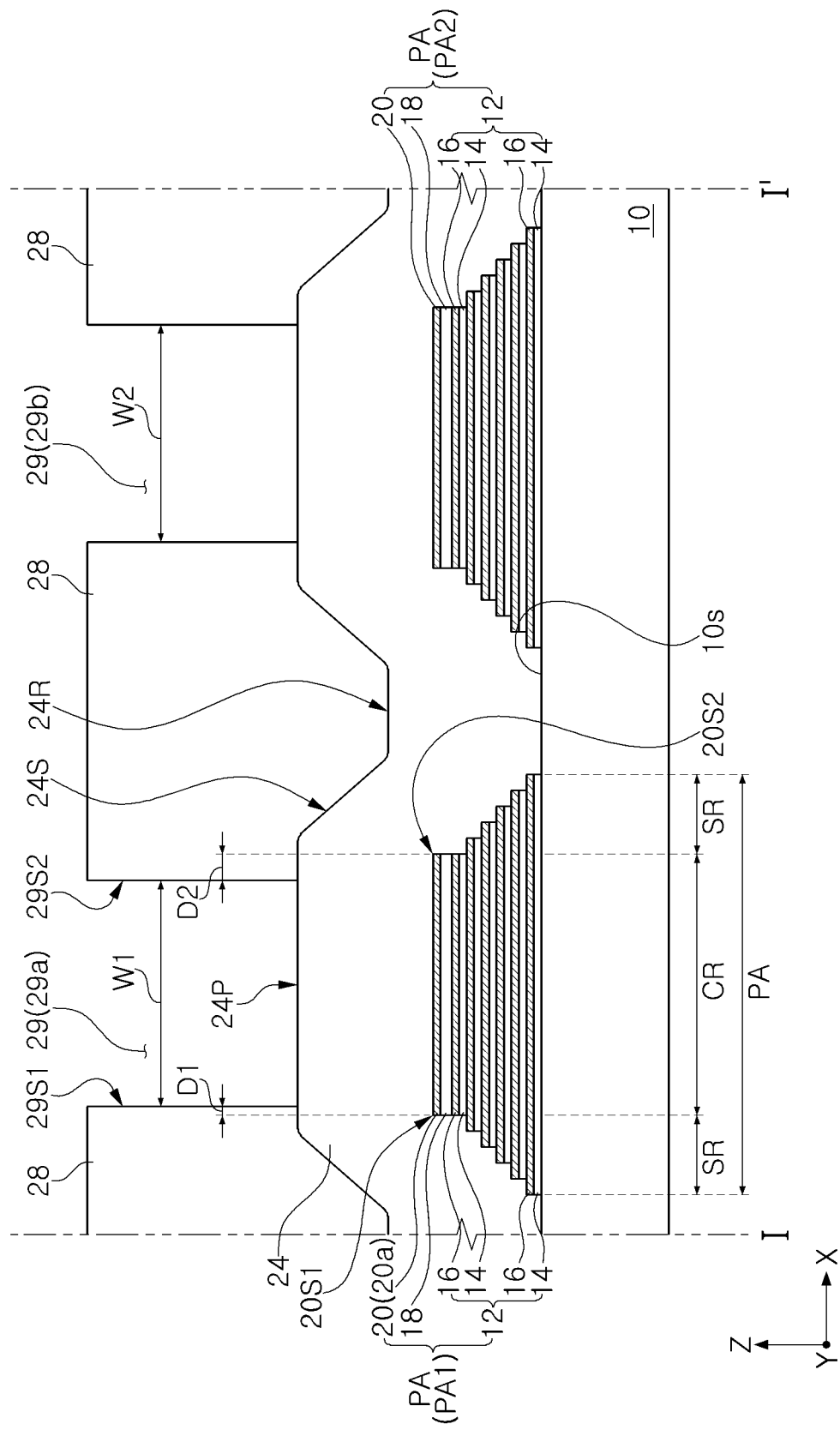
Figure 5B:
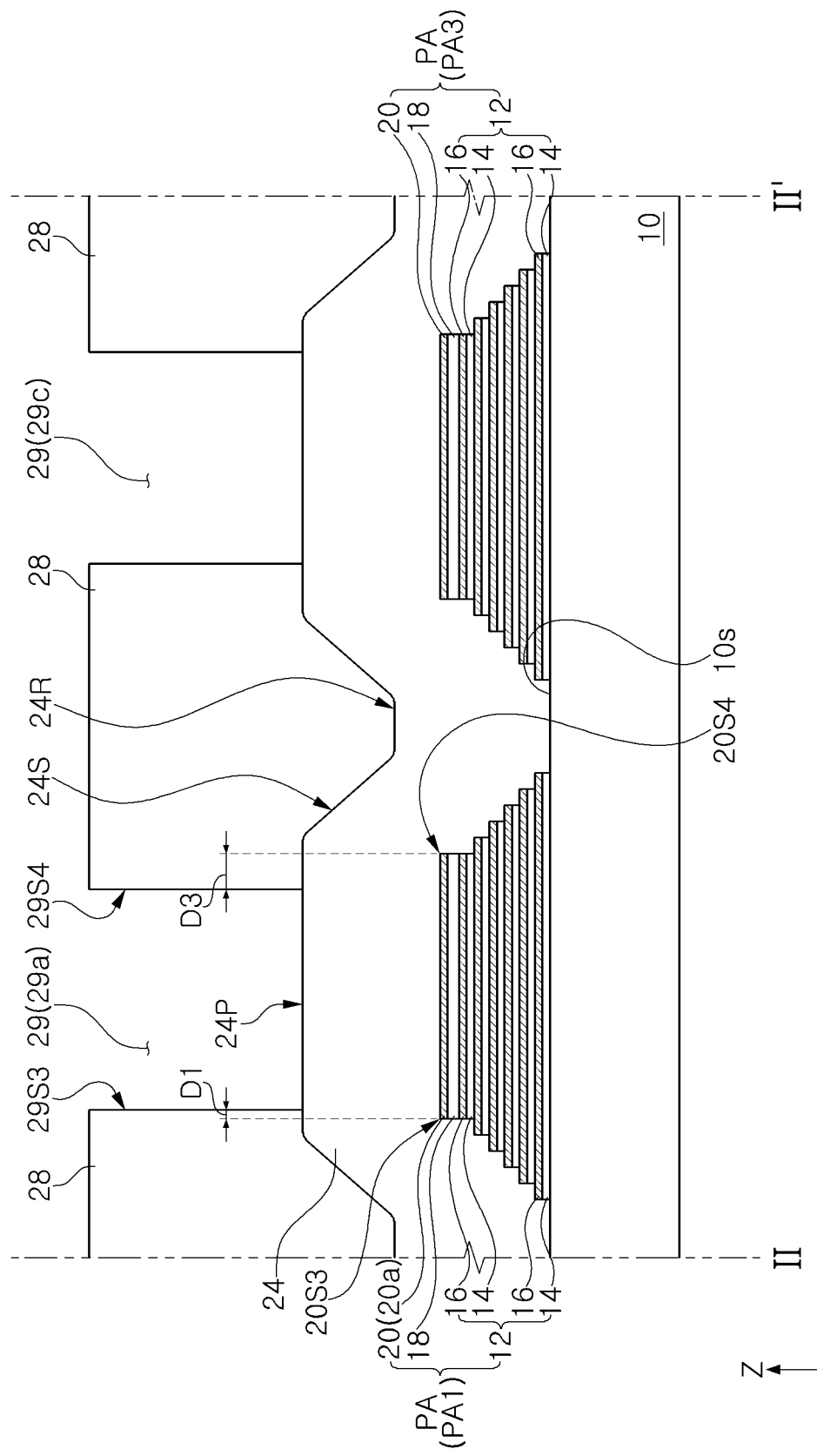
Figure 6A:
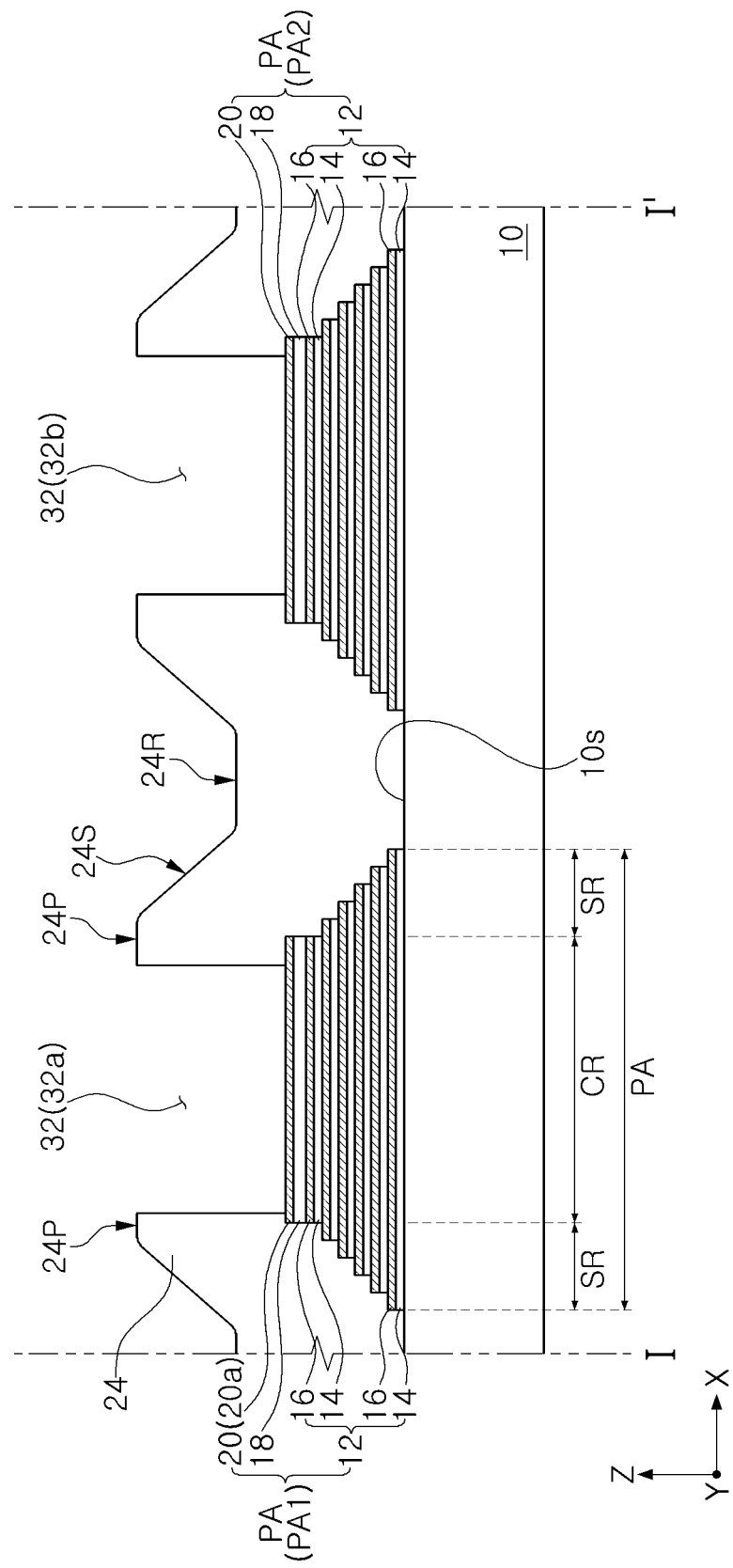
Figure 6B:
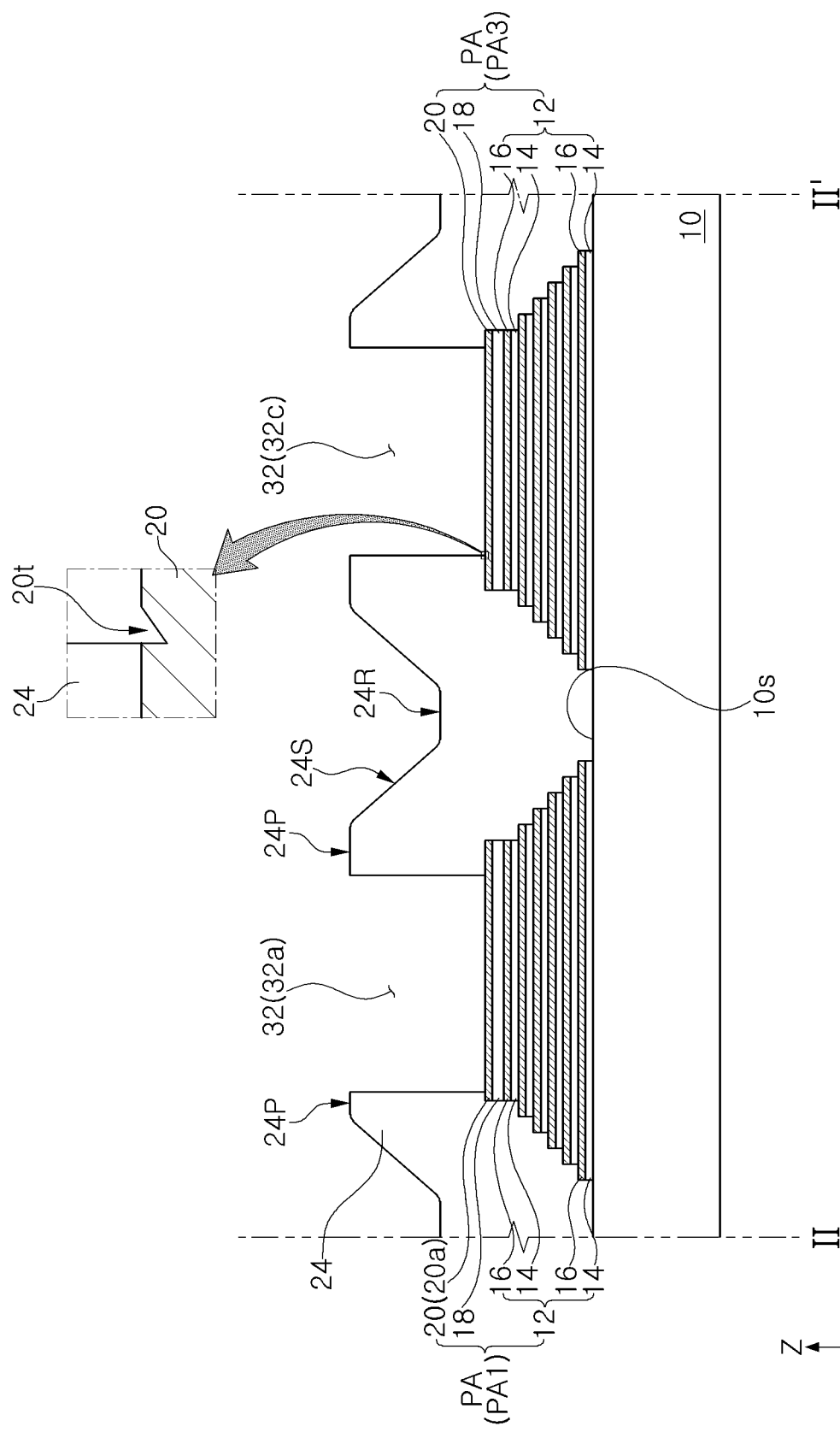
Figure 7A:
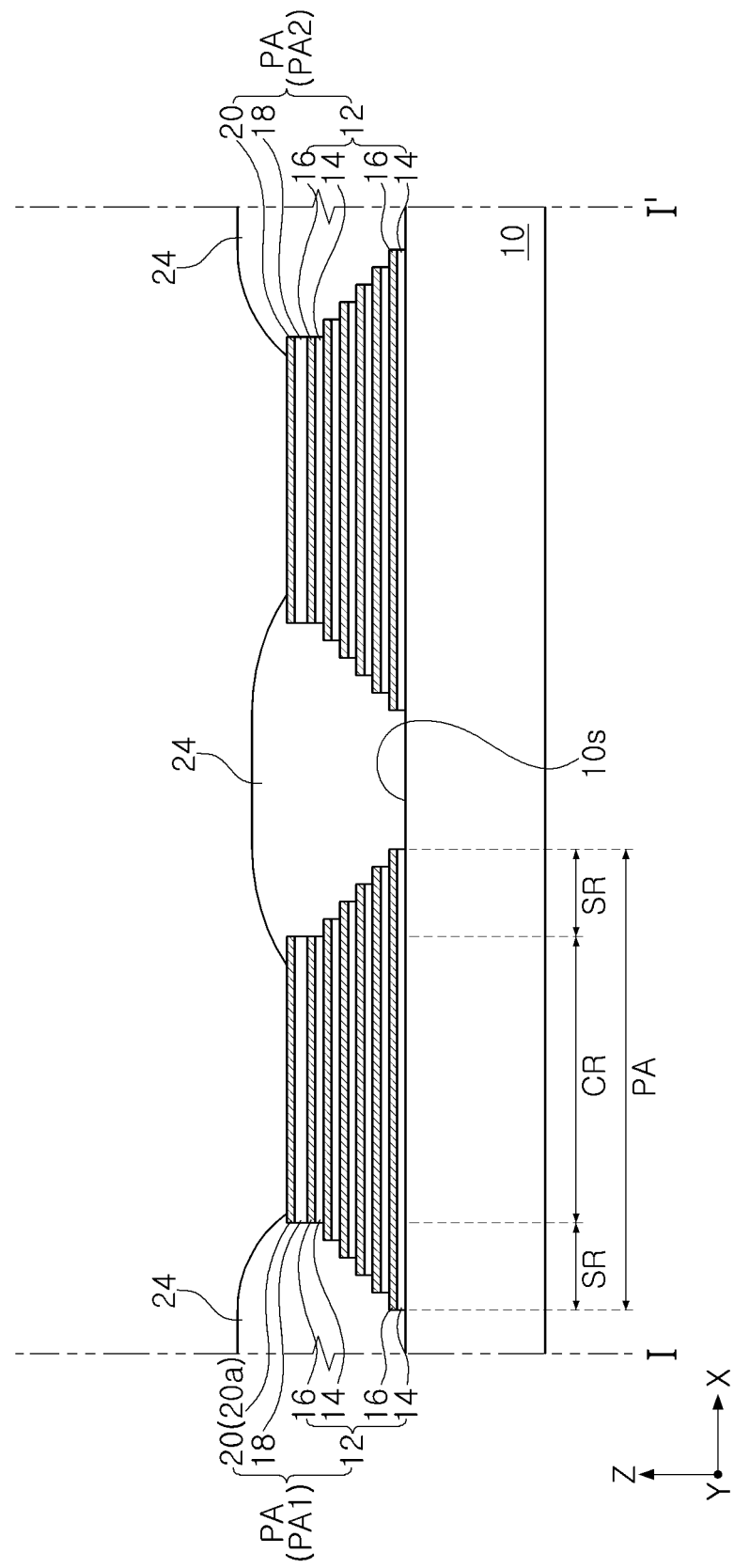
Figure 7B:
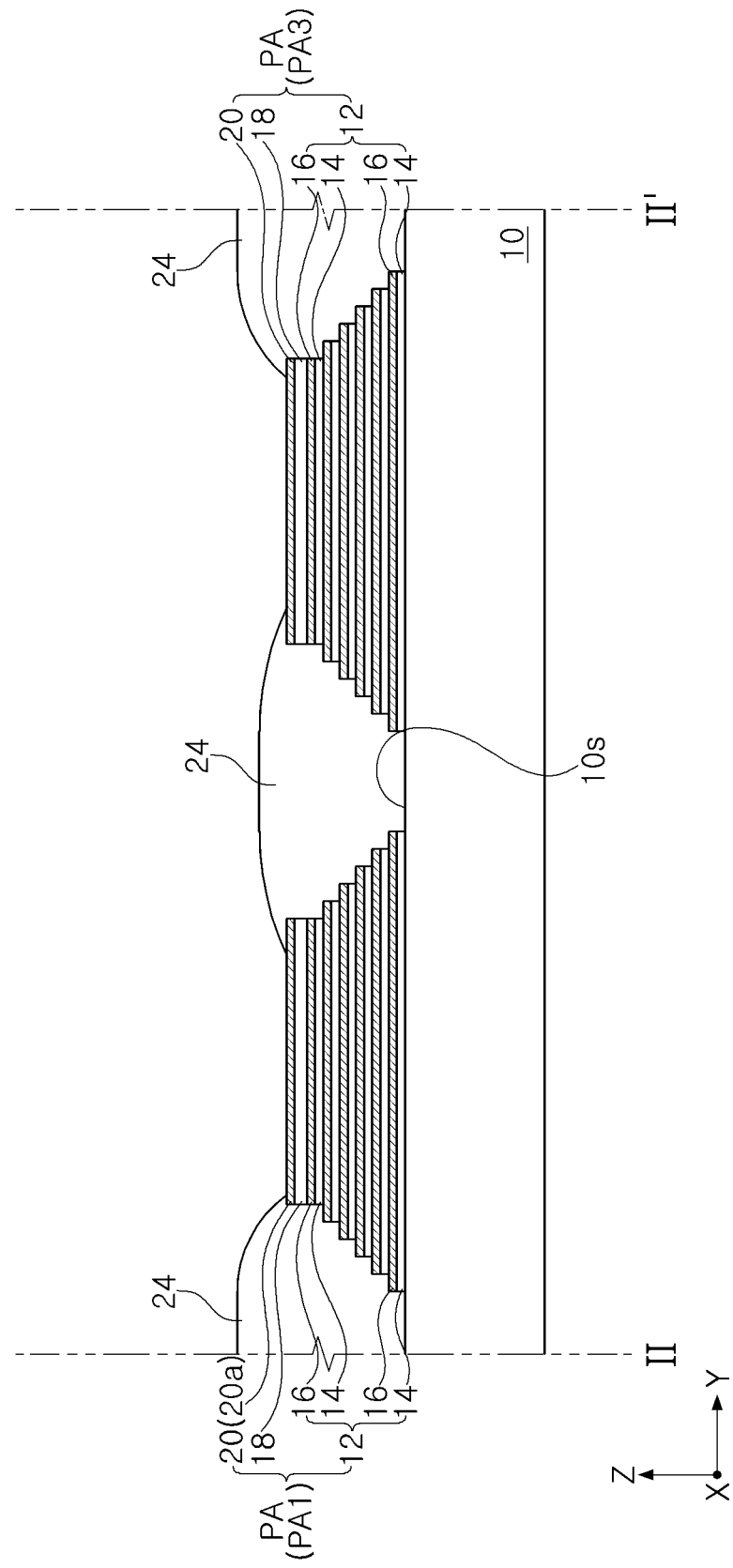
Figure 16:
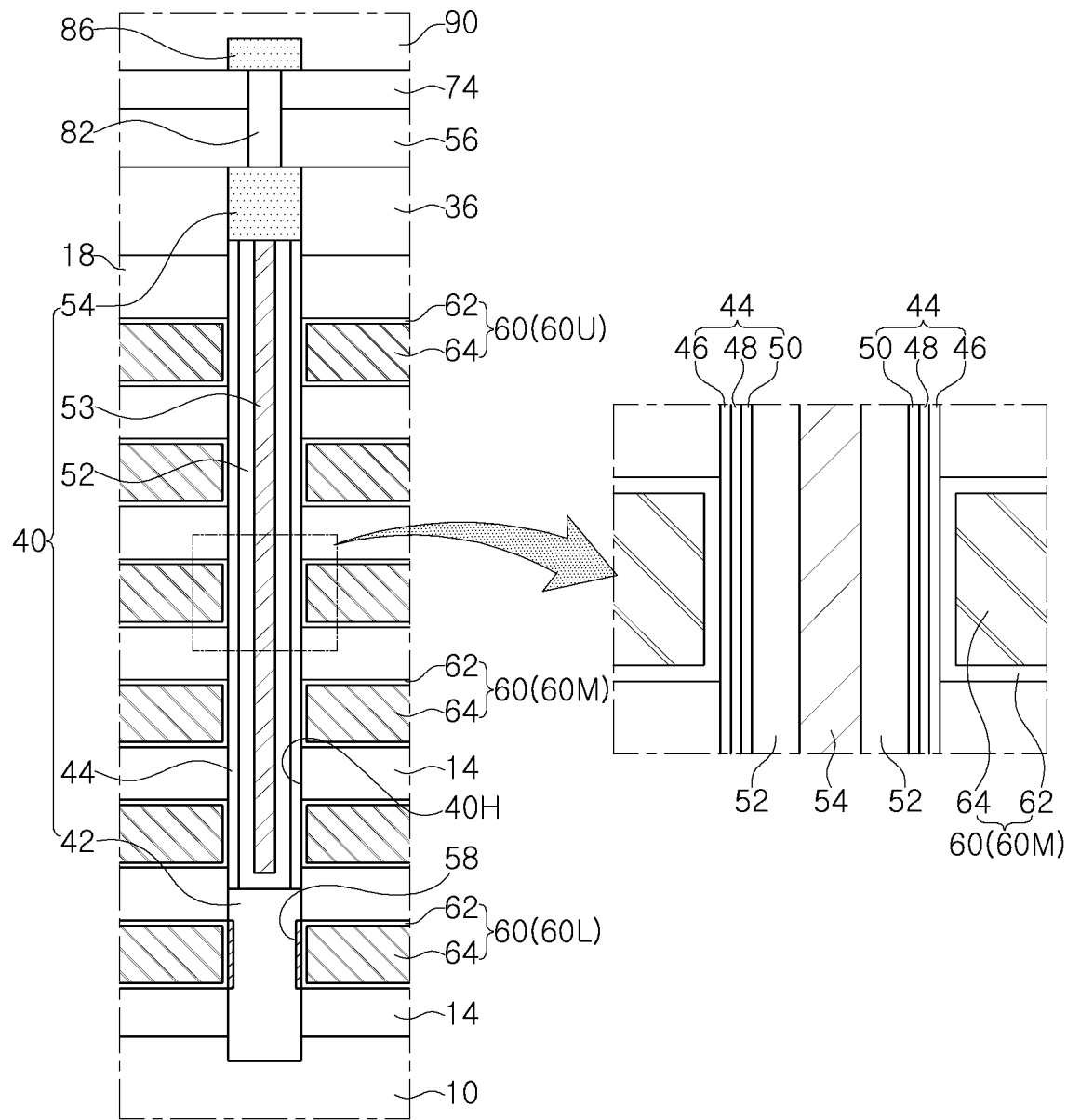
FIG. 16 is a partially enlarged cross-sectional view illustrating a portion of a semiconductor device according to some embodiments of the present inventive concepts.
Figure 17:
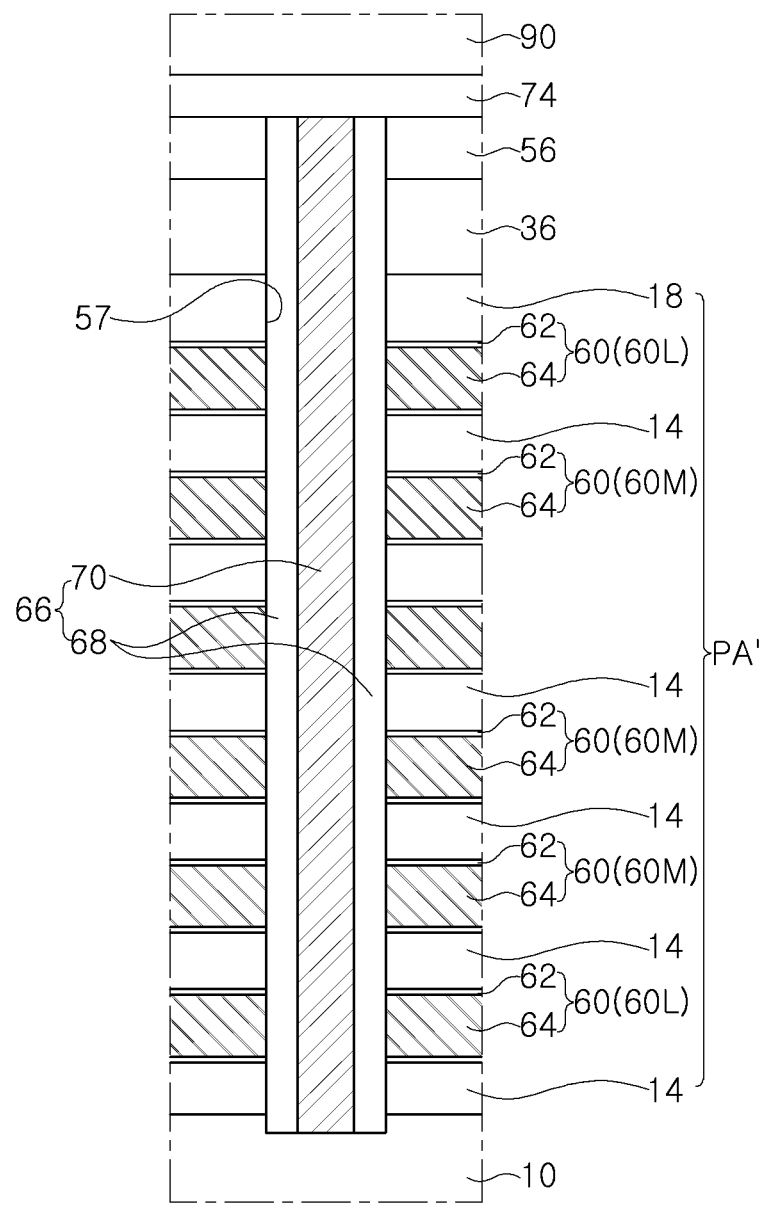
FIG. 17 is a partially enlarged cross-sectional view illustrating a portion of a semiconductor device according to some embodiments of the present inventive concepts.
Figure 18:
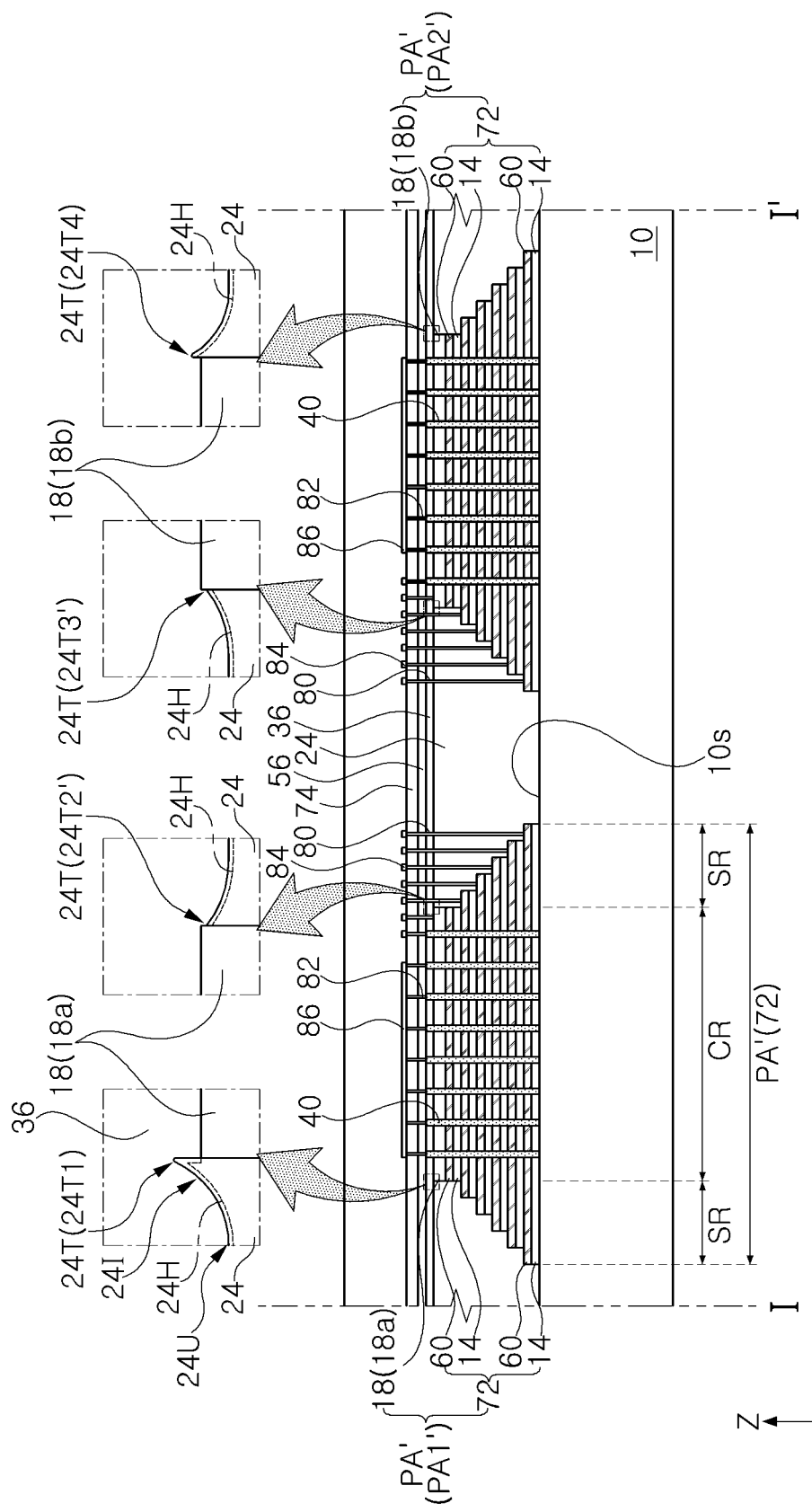
FIG. 18 is a cross-sectional view illustrating modified embodiments of a semiconductor device according to some embodiments of the present inventive concepts.
Figure 19:
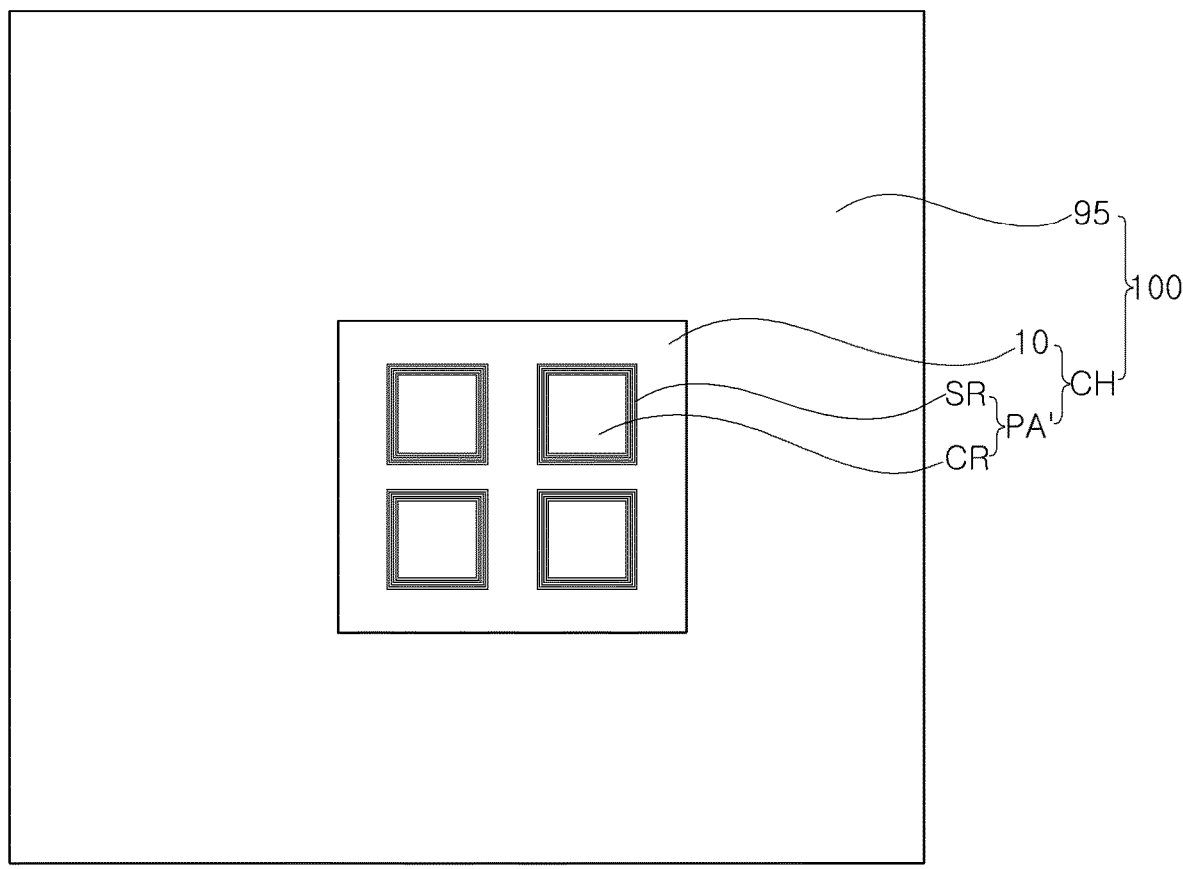
FIG. 19 is a plan view illustrating a semiconductor device according to some embodiments of the present inventive concepts.

Hereinafter, various embodiments of a method of forming a semiconductor device according to some embodiments of the present inventive concepts will be described with reference to FIGS. 1A to 19. FIGS. 1A and 1B are flowcharts illustrating a method of forming a semiconductor device according to some embodiments of the present inventive concepts. FIG. 2 is a plan view illustrating a method of forming a semiconductor device according to some embodiments of the present inventive concepts. FIG. 3 is a partially enlarged view of a portion of FIG. 2. FIGS. 4A to 15B are views illustrating methods of forming a semiconductor device according to some embodiments of the present inventive concepts. FIG. 16 is a partially enlarged cross-sectional view illustrating a portion of a semiconductor device according to some embodiments of the present inventive concepts. FIG. 17 is a partially enlarged cross-sectional view illustrating a portion of a semiconductor device according to some embodiments of the present inventive concepts. FIG. 18 is a cross-sectional view illustrating modified embodiments of a semiconductor device according to some embodiments of the present inventive concepts. FIG. 19 is a plan view illustrating a semiconductor device according to some embodiments of the present inventive concepts.

Figure 8A:
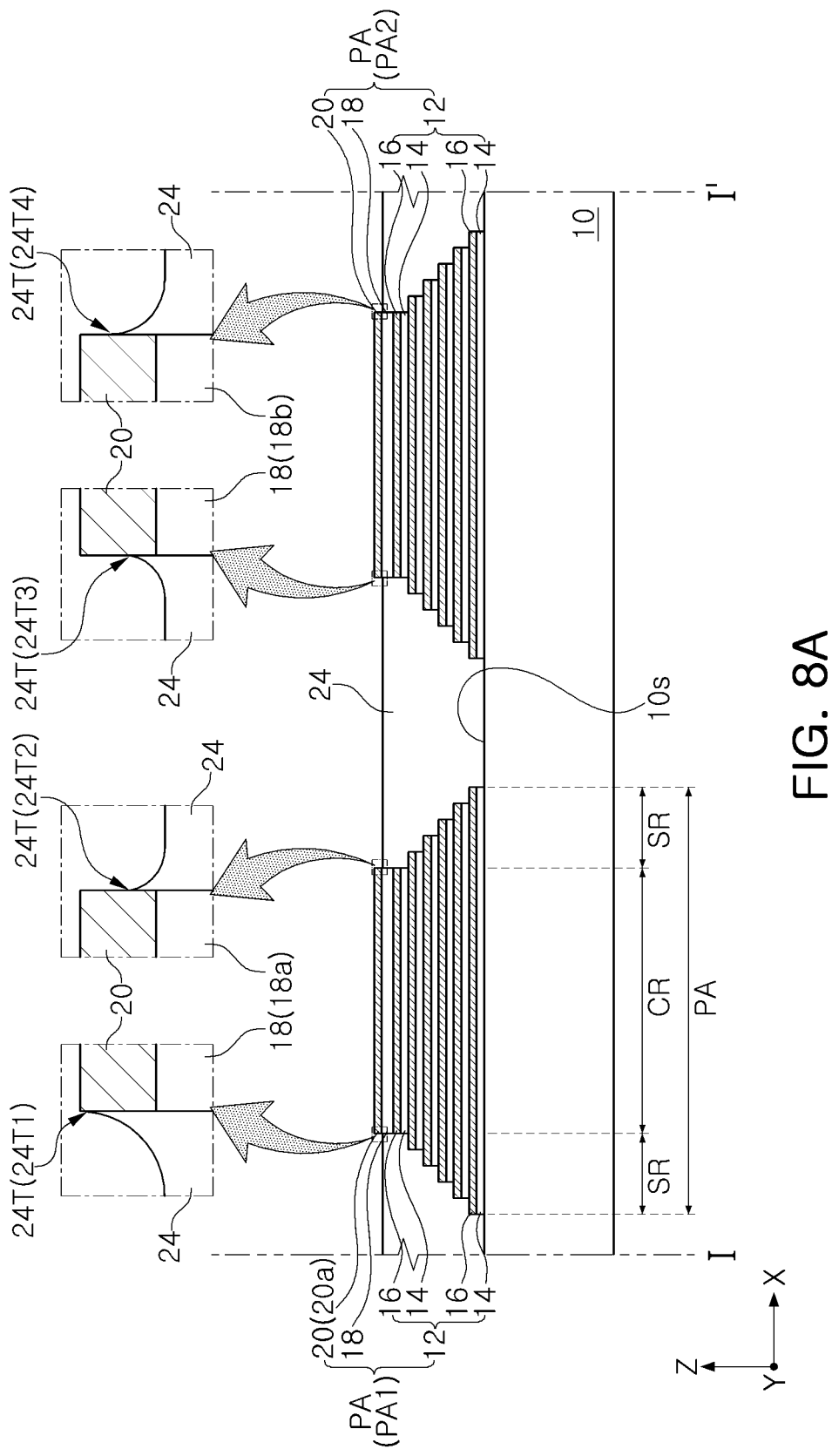
Figure 8B:
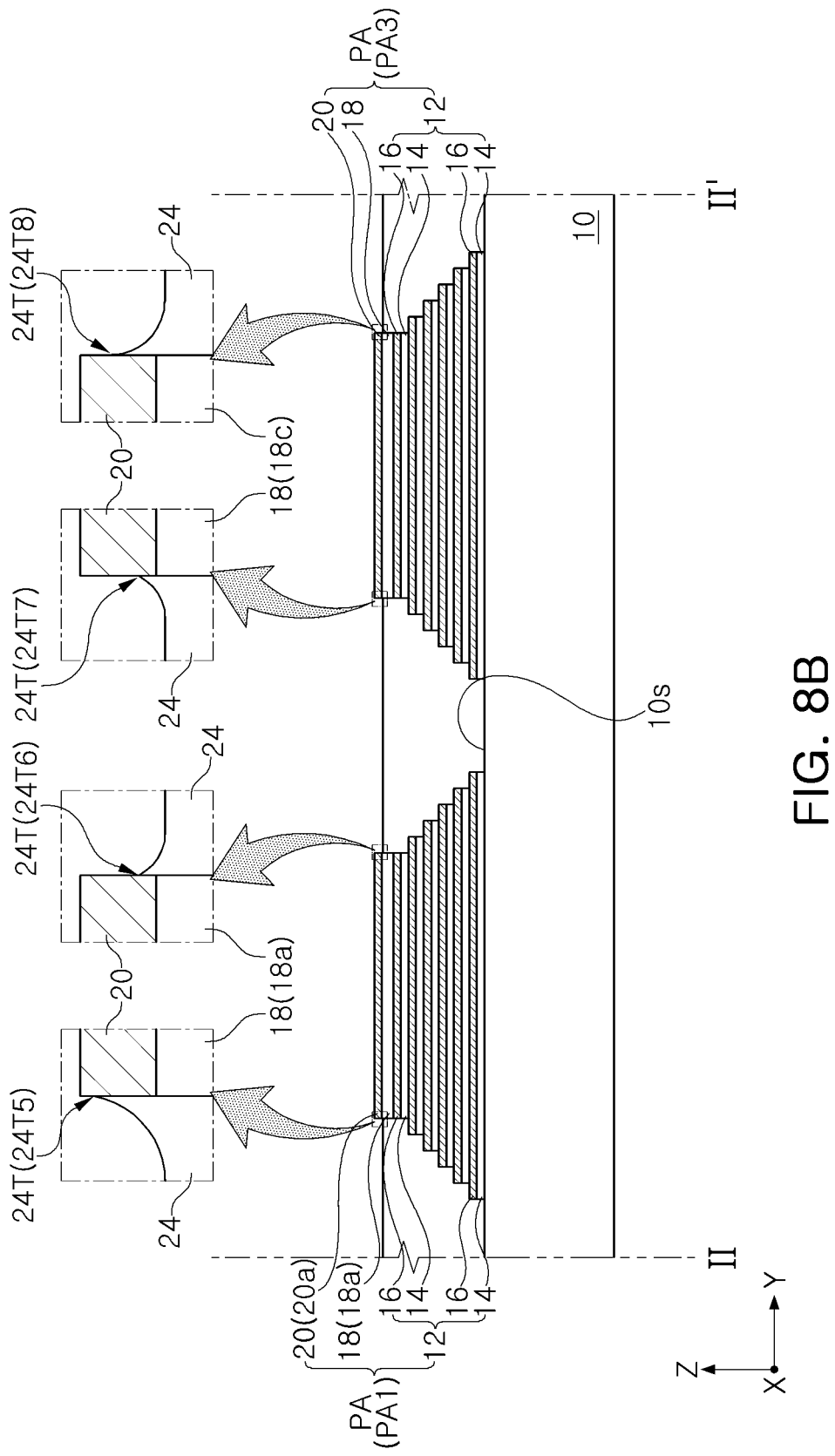
Figure 9:
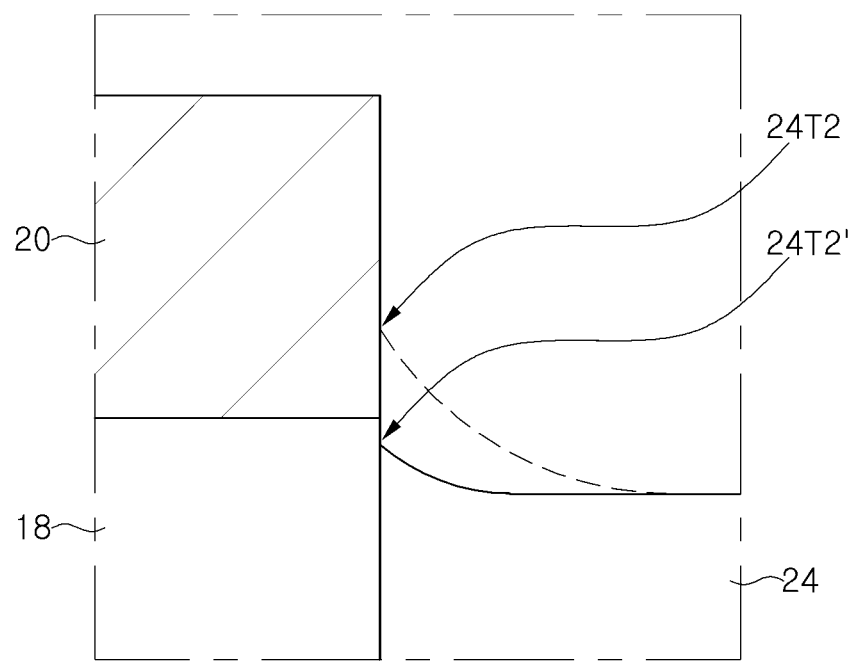
Figure 10A:
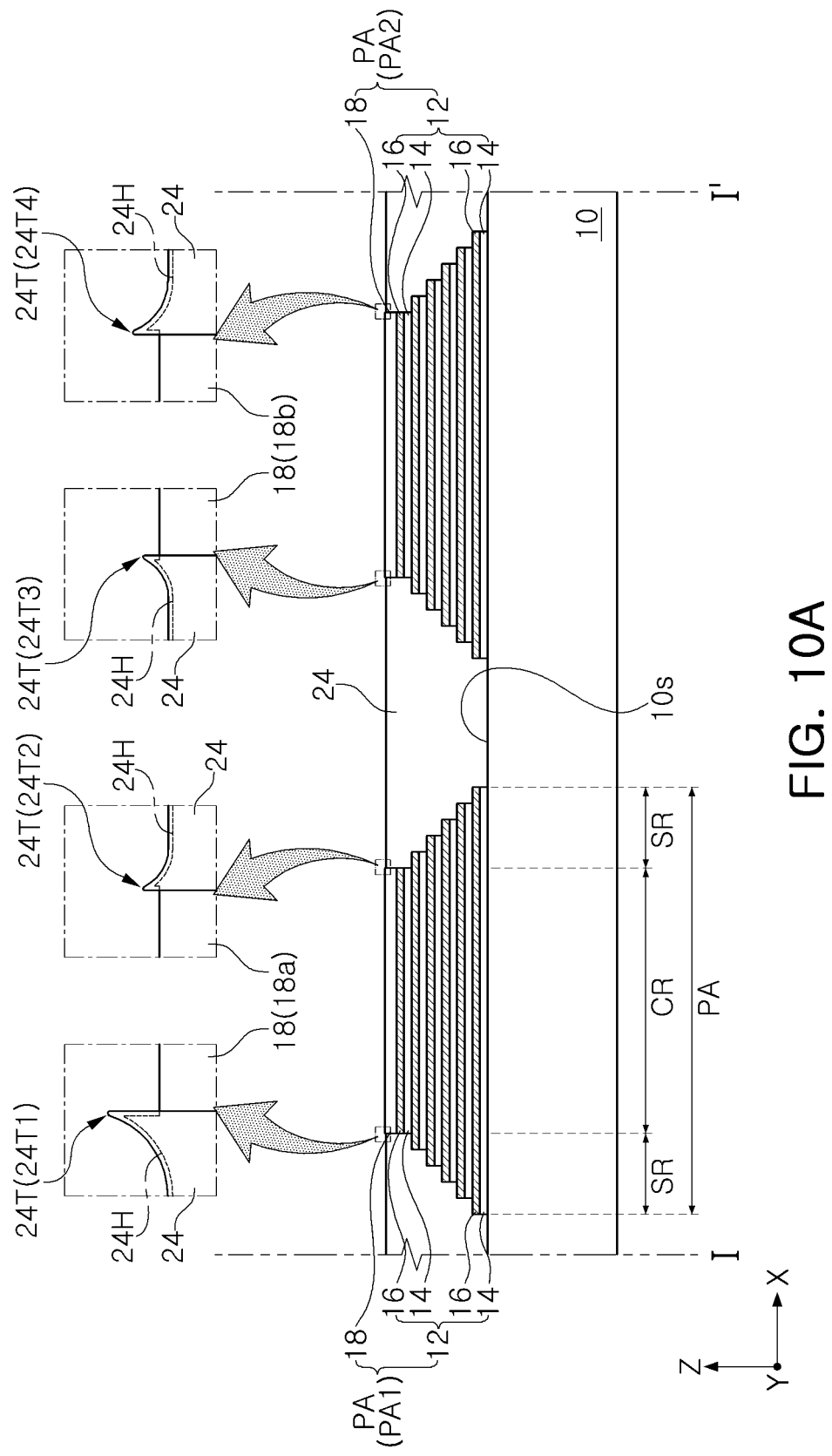
Figure 10B:
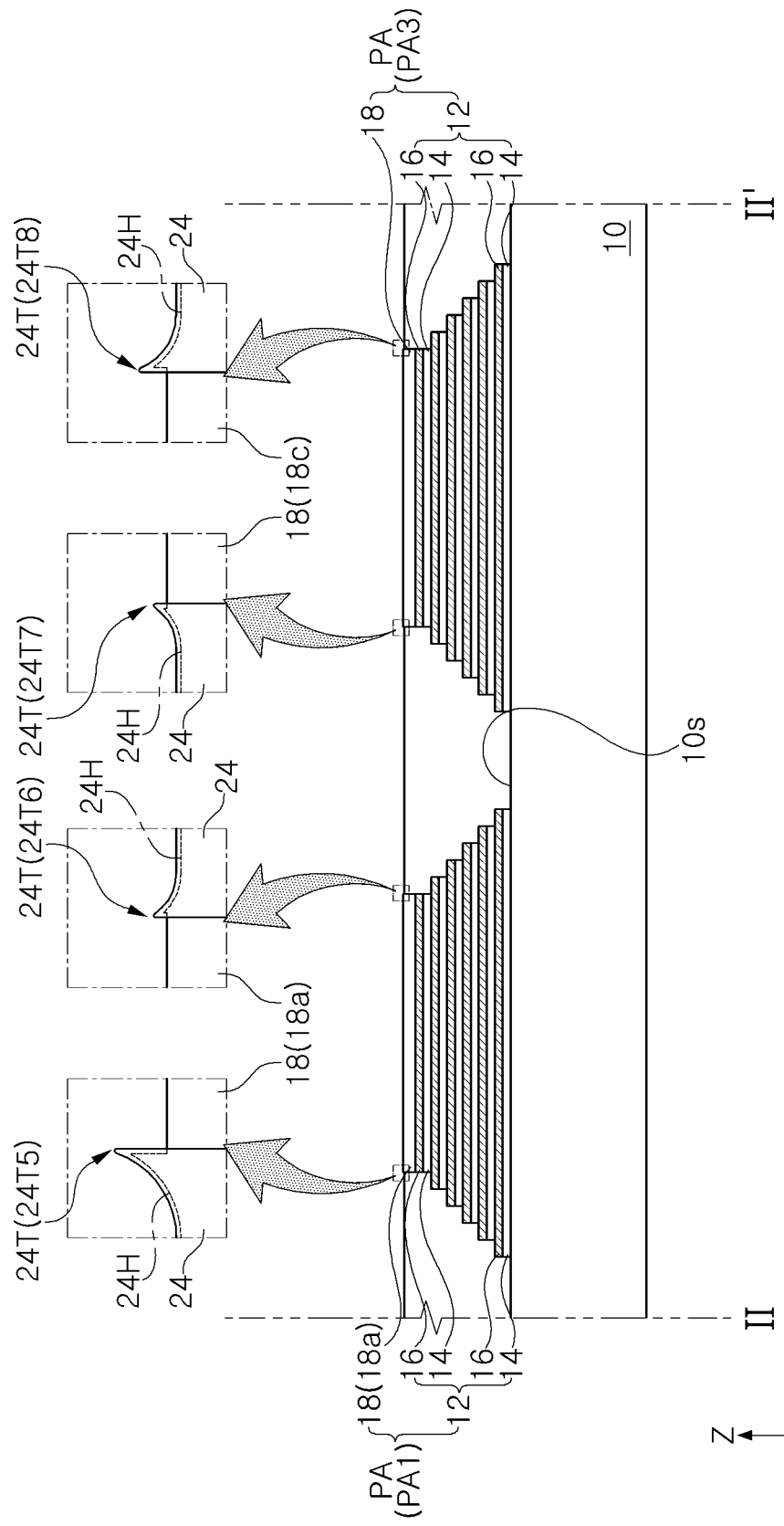
Figure 11A:
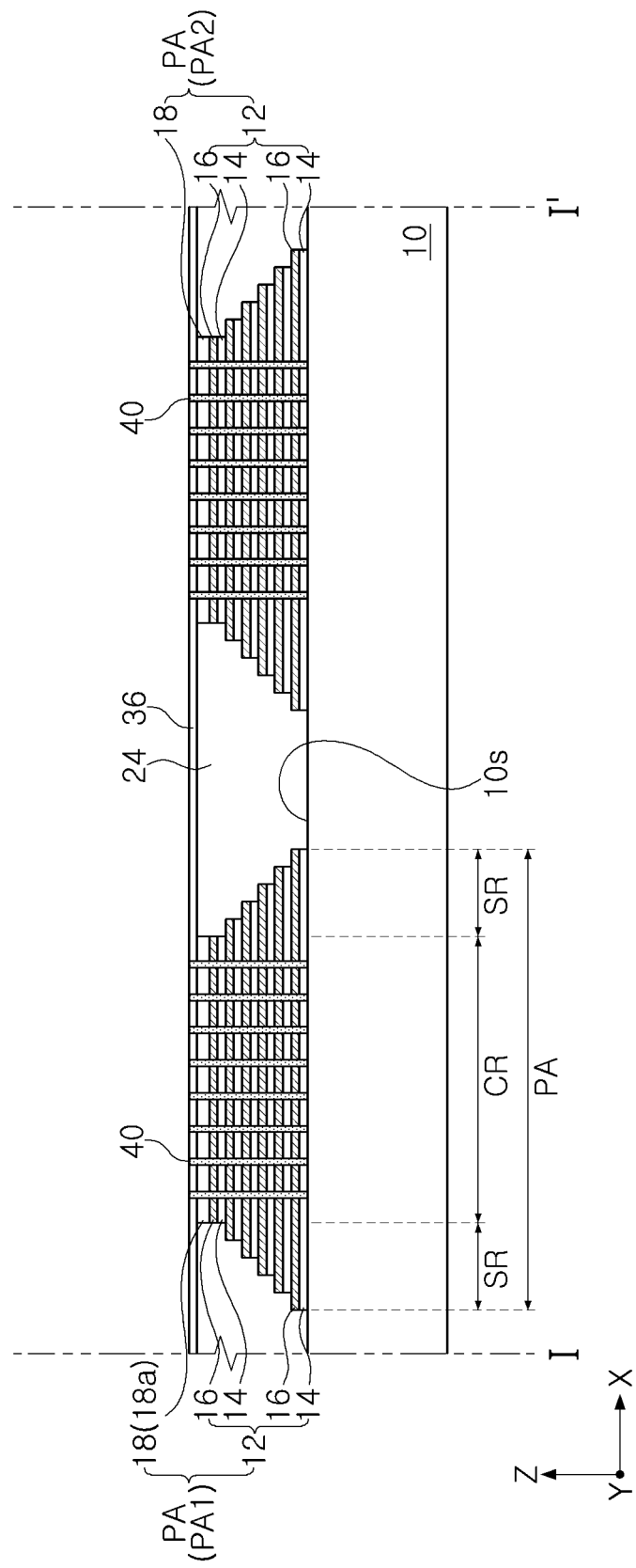
Figure 11B:
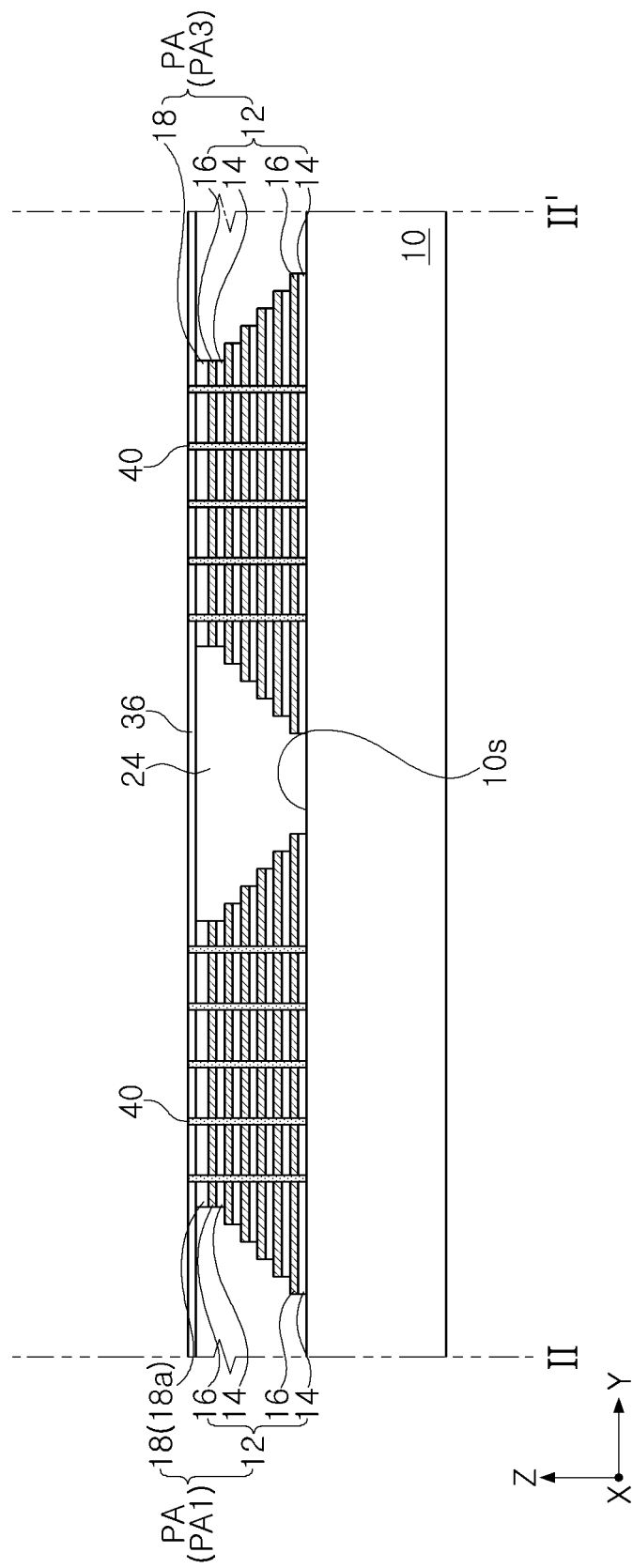
Figure 14:
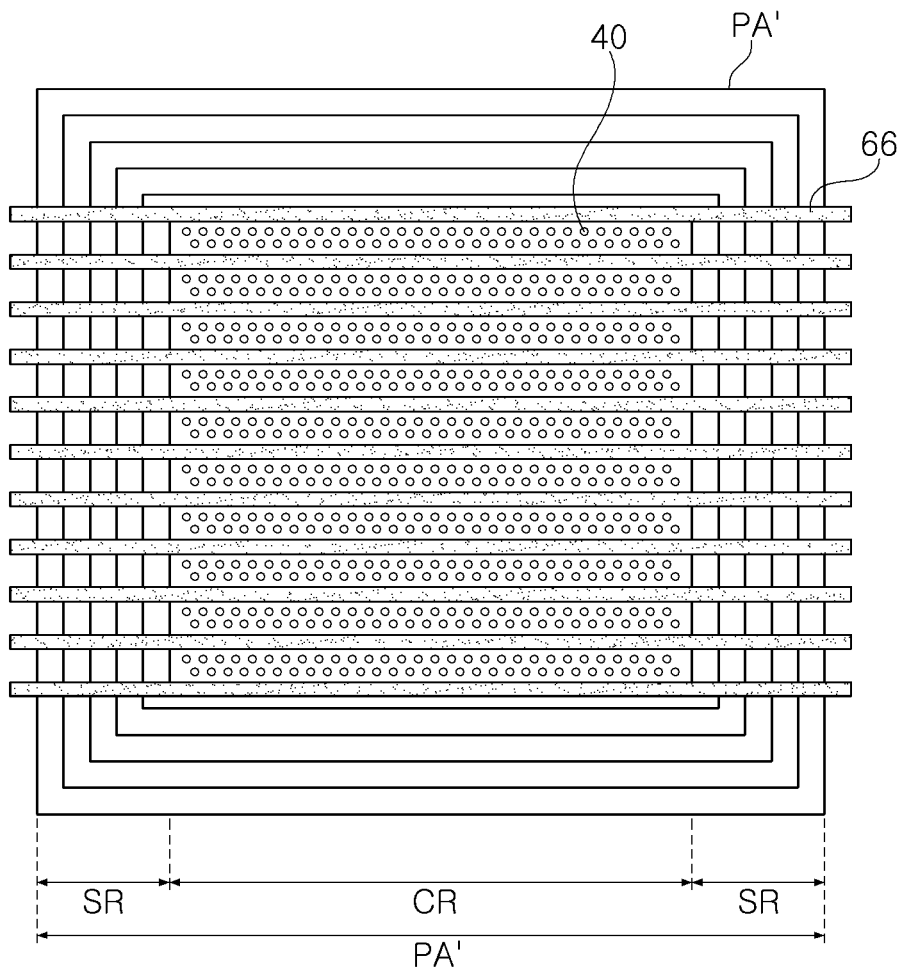
Figure 15A:
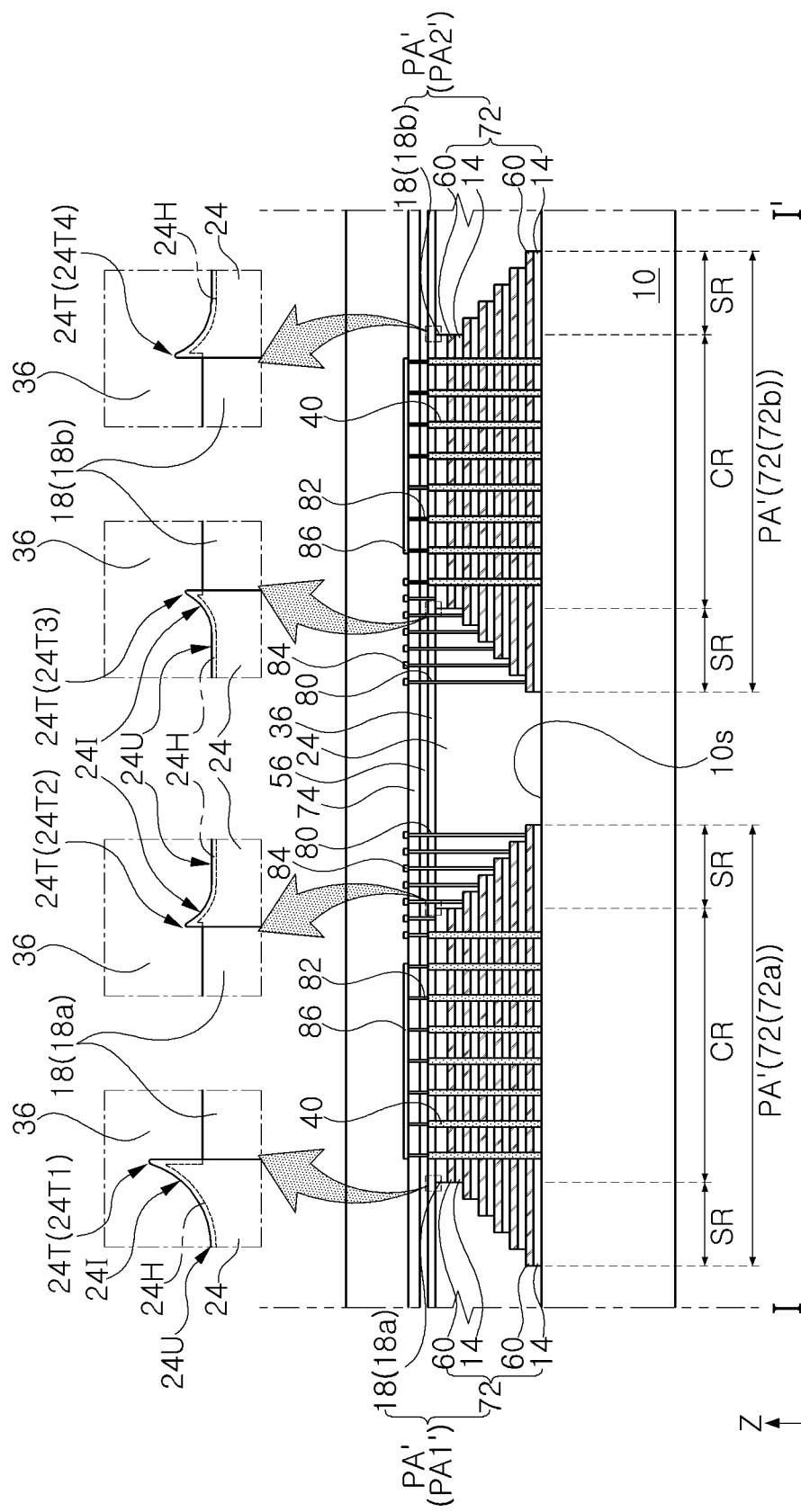
Figure 15B:
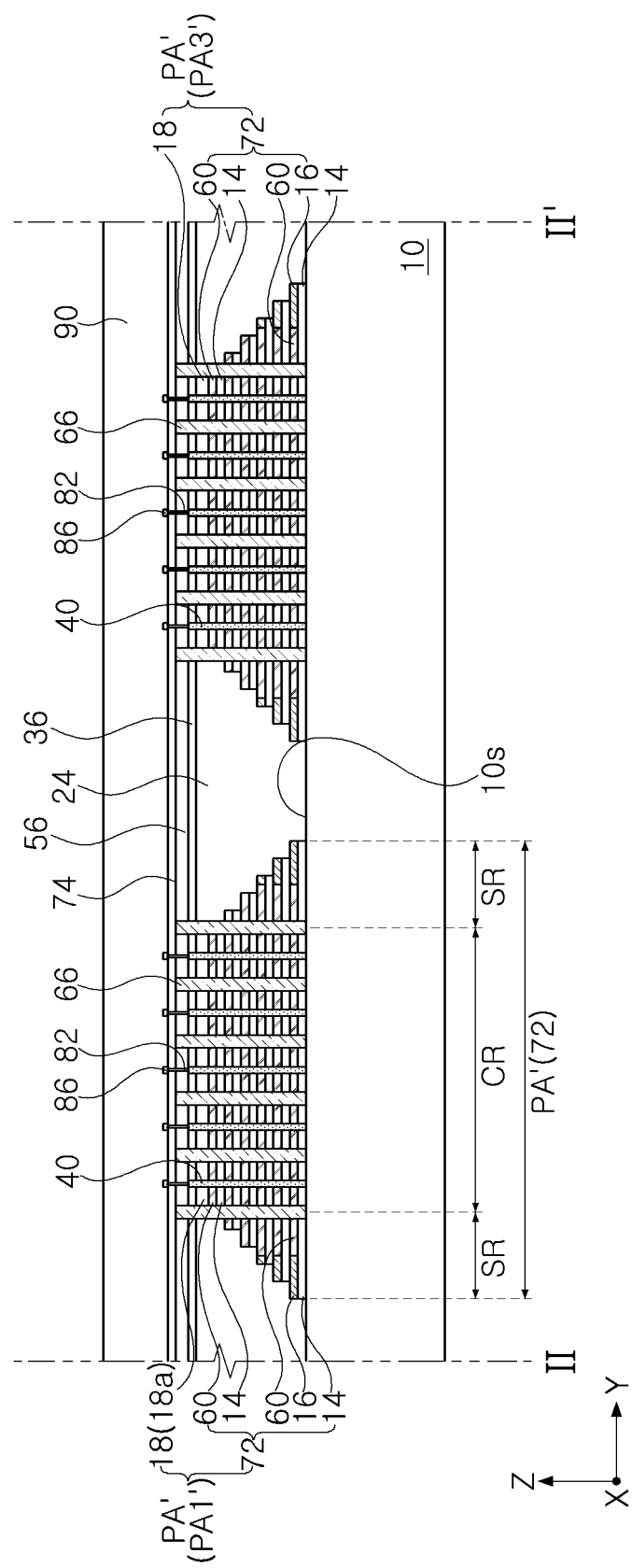

In FIGS. 4A to 15B, FIGS. 4A, 5A, 6A, 7A, 8A, 10A, 12A, 13A, and 15A are cross-sectional views illustrating regions taken along a line I-I' in FIG. 3, FIGS. 4B, 5B, 6B, 7B, 8B, 10B, 12B, 13B, and 15B are cross-sectional views illustrating regions taken along a line I-I' in FIG. 3, FIG. 9 is a partially enlarged cross-sectional view illustrating modified embodiments of a method of forming a semiconductor device according to some embodiments of the present inventive concepts, and FIG. 14 is a partially enlarged plan view illustrating an example of a method of forming a semiconductor device according to some embodiments of the present inventive concepts.

Referring to FIGS. 1A, 2, 3, 4A, and 4B, protrusion structures PA may be formed on a substrate 10 (S5). The substrate 10 may be a semiconductor wafer. The substrate 10 may include a plurality of shot areas SA through which light from the exposure apparatus may be irradiated to perform a light exposure process. Each of the shot areas SA may include a plurality of chip areas CA. The protrusion structures PA may be formed on the substrate 10. The protrusion structures PA may be formed in each of the chip areas CA.

The protrusion structures PA formed on the substrate 10 may be disposed such that a distance in a first direction X and a distance in a second direction Y are different in one chip area CA. It will be understood that, although the terms first, second, third, etc. may be used herein to describe various elements, and elements should not be limited by these terms. Rather, these terms are only used to distinguish one element from another element. Thus, a first element discussed could be termed a second element without departing from the scope of the present inventive concepts.

Each of the protrusion structures PA may include a central region CR and a stepped region SR. Formation of the protrusion structures PA may include forming interlayer insulation layers 14 and gate layers 16 that are alternately and repeatedly stacked on the substrate 10, forming an upper insulation layer 18 and a planarization stop 20 in sequence, and patterning the planarization stop layer 20, the upper insulation layer 18, the interlayer insulation layers 14, and the gate layers 16. The planarization stop layer 20 and the upper insulation layer 18 may remain in the central region CR. The interlayer insulation layers 14 and the gate layers 16 may be alternately and repeatedly stacked in the central region CR, and extend into the stepped region SR to remain in a shape having a stepped structure within the stepped region SR. The interlayer insulation layers 14 and the gate layers 16 may constitute a molded structure 12. Therefore, each of the protrusion structures PA may include the molded structure 12, and the upper insulation layer 18 and the planarization stop layer 20 which are stacked on the molded structure 12 in sequence.

The interlayer insulation layers 14 may be formed of silicon oxide.

In some embodiments, the gate layers 16 may be formed of an insulating material having an etch selectivity with the interlayer insulation layers 14, e.g., silicon nitride.

In some embodiments, the gate layers 16 may be formed of a conductive material having etch selectivity with the interlayer insulation layers 14, e.g., one or more of doped polysilicon, a metal nitride (e.g., TiN), a metal-semiconductor compound (e.g., TiSi, WSi, etc.), and a metal (e.g., W), or a combination thereof.

A capping insulation layer 24 may be formed on the substrate having the protrusion structures PA (S10). The capping insulation layer 24 may be formed of silicon oxide, or a porous oxide, having a density lower than that of the upper insulation layer 18. For example, the capping insulation layer 24 may be formed of a low-k dielectric. The capping insulation layer 24 may include an oxide formed by a flowable CVD or a Spin On Glass (SOG) having a higher deposition rate or a higher deposition rate than the upper insulation layer 18. The upper insulation layer 18 may be formed of silicon oxide, e.g., TEOS oxide.

The capping insulation layer 24 may be formed to have a curved shape by a step difference of the protrusion structures PA. For example, an upper surface of the capping insulation layer 24 may include protrusion surfaces 24P protruding in the central regions CR of the protrusion structures PA in an upward direction, a recessed surface 24R positioned on the substrate between the protrusion structures PA, and an inclined surface 24S between the protrusion surfaces 24P and the recessed surface 24R. The recessed surface 24R of the upper surface of the capping insulation layer 24 may be higher than height of an upper surface of the planarization stop layer 20 of the protrusion structures PA.

In some embodiments, 'height' or 'height level' may be defined based on an upper surface 10s of the substrate 10. For example, the same height level may refer to being positioned at the same height from the upper surface 10s of the substrate 10 in a vertical direction Z. The vertical direction Z may be perpendicular to the upper surface 10s of the substrate 10.

The shot areas SA may include a first shot area SA1 and a second shot area SA2 that are adjacent to each other. The plurality of chip areas CA in the first shot area SA1 may include a first chip area CA1 and a second chip area CA2 that are adjacent to each other in a first direction X. The plurality of chip areas CA in the first shot area SA1 may include a third chip area CA3 adjacent to the first chip area CA1 in a second direction Y. The first and second directions X and Y may be perpendicular to each other, and may be parallel to the upper surface 10s of the substrate 10.

The first chip area CA1 may include a plurality of protrusion structures PA. For example, the first chip area CA1 may include a first protrusion structure PA1 and a second protrusion structure PA2 that are adjacent to each other in the first direction X. The first chip area CA1 may be formed by first and second protrusion structures PA1 and PA2 that are adjacent to each other in the first direction X, and third and fourth protrusion structures PA3 and PA4 that are adjacent to each other in the second direction Y.

In some embodiments, a first distance L1 between the first protrusion structure PA1 and the second protrusion structure PA2, adjacent to each other in the first direction X, may be greater than a second distance L2 between the first protrusion structure PA1 and the third protrusion structure PA3, adjacent to each other in the second direction Y.

In some embodiments, a third distance L3 between the second protrusion structure PA2 in the first chip area CA1 and a protrusion structure PA (PA5) in the second chip area CA2, adjacent to each other, may be smaller than a fourth distance L4 between first the protrusion structure PA1 in the first shot area SA1 and a protrusion structure PA (PA6) in the second shot area SA2, adjacent to each other.

In some embodiments, the third distance L3 between the second protrusion structure PA2 in the first chip area CA1 and the protrusion structure PA (PA5) in the second chip area CA2, adjacent to each other, may be greater than distances L1 and L2 between the protrusion structures PA1, PA2, PA3, and PA4 that are adjacent to each other in the first chip area CA1. For example, the third distance L3 may be greater than each of the first distance L1 and the second distance L2.

Referring to FIGS. 1A, 2, 3, 5A, and 5B, a mask pattern 28 having openings 29 on the capping insulation layer 24 may be formed (S15). The mask pattern 28 may be a photoresist pattern. The openings 29 may expose the capping insulation layer 24. The openings 29 may overlap the planarization stop layer 20 of the protrusion structures PA. In some embodiments, each of the openings 29 may have a narrower width or a smaller size than the planarization stop layer 20.

The distances L1, L2, L3, and L4 between the protrusion structures PA adjacent to each other in the first direction X or the second direction Y may be varied as described above.

The size of the openings 29 may be varied according to the distance between the protrusion structures PA adjacent to each other in the first direction X or the second direction Y. Alternatively, spacing distances between conceptual lines extending from the side walls of the openings 29 and the side walls of the planarization stop layer 20 in an upward direction, i.e., in the vertical direction Z, may be determined in accordance with the distance between the protrusion structures PA adjacent to each other in the first direction X or the second direction Y. For example, when a spacing distance between the protrusion structures PA adjacent to each other is relatively long, a distance between conceptual lines extending from the side walls of the openings 29 and the side surfaces of the planarization stop layer 20 in an upward direction Z may be relatively long. In some embodiments, when a spacing distance between the protrusion structures PA adjacent to each other is relatively short, a distance between conceptual lines extending from the side walls of the openings 29 and the side surfaces of the planarization stop layer 20 in an upward direction Z may be relatively short. When a spacing distance between the protrusion structures PA adjacent to each other is in a relatively median length, a distance between conceptual lines extending from the side walls of the openings 29 and the side surfaces of the planarization stop layer 20 in an upward direction Z may be in a relatively median length.

As described above, a distance between conceptual lines extending from the side walls of the openings 29 and the side surfaces of the planarization stop layer 20 in an upward direction Z may be determined according to a spacing distance between the protrusion structures PA adjacent to each other.

Some embodiments in which a distance between conceptual lines extending from the side walls of the openings 29 and the side surfaces of the planarization stop layer 20 in an upward direction Z is determined according to a spacing distance between the protrusion structures PA adjacent to each other will be described below.

The openings 29 may include a first opening 29a on a planarization stop layer 20a of the first protrusion structure PA1 described above.

The planarization stop layer 20a of the first protrusion structure PA1 may have a first side surface 20S1 and a second side surface 20S2 facing each other in the first direction X. The first side surface 20S1 of the planarization stop layer 20a of the first protrusion structure PA1 may face the protrusion structure PA in the second shot area SA2 spaced apart from the first protrusion structure PA1 by the fourth distance L4. The second side surface 20S2 of the planarization stop layer 20a of the first protrusion structure PA1 may face the second protrusion structure PA2 spaced apart from the first protrusion structure PA1 by the first distance L1. The first opening 29a may have a first side wall 29S1 and a second side wall 29S2 facing each other in the first direction X. The first side wall 29S1 of the first opening 29a may be adjacent to the first side surface 20S1, and/or the second side wall 29S2 may be adjacent to the second side surface 20S2.

The planarization stop layer 20a of the first protrusion structure PA1 may have a third side surface 20S3 and a fourth side surface 20S4 facing each other in the second direction Y. The third side surface 20S3 of the planarization stop layer 20a of the first protrusion structure PA1 may face the protrusion structure PA in the other shot area SA spaced apart from the first protrusion structure PA1 by the fourth distance L4. The fourth side surface 20S4 of the planarization stop layer 20a of the first protrusion structure PA1 may face the third protrusion structure PA3 spaced apart from the first protrusion structure PA1 by the second distance L2.

The first opening 29a may have a third side wall 29S3 and a fourth side wall 29S4 facing each other in the second direction Y. In the first opening 29a, the third side wall 29S3 may be adjacent to the third side surface 20S3, and the fourth side wall 29S4 may be adjacent to the fourth side surface 20S4.

A first distance D1 between an conceptual line extending from the first side surface 20S1 of the planarization stop layer 20a of the first protrusion structure PA1 in the upward direction Z and the first side wall 29S1 of the first opening 29a may be different from a second distance D2 between an conceptual line extending from the second side surface 20S2 of the planarization stop layer 20a of the first protrusion structure PA1 in the upward direction Z and the second side wall 29S2 of the first opening 29a. For example, the second distance D2 may be greater than the first distance D1.

A conceptual line extending from the third side surface 20S3 of the planarization stop layer 20a of the first protrusion structure PA1 in the upward direction Z and the third side wall 29S3 of the first opening 29a may be spaced apart from each other by the first distance D1.

A conceptual line extending from the fourth side surface 20S4 of the planarization stop layer 20a of the first protrusion structure PA1 in the upward direction Z and the fourth side wall 29S4 of the first opening 29a may be spaced apart from each other by a third distance D3, greater than the second distance D2. Magnitudes of the first to third distances D1, D2, and D3 may be determined in accordance with a predetermined rule. Therefore, size and position of the first opening 29a may be determined. Likewise, size and position of a second opening 29b and a third opening 29c may be determined. For example, when viewed in the first direction X, the third distance L3 between the protrusion structure PA in the second chip area CA2 adjacent to the second protrusion structure PA2 and the second protrusion structure PA2 may be shorter than the fourth distance L4 between the protrusion structure PA in the second shot area SA2 adjacent to the first protrusion structure PA1 and the first protrusion structure PA1. Therefore, a width W2 of the second opening 29b on the second protrusion structure PA2 in the first direction X may be less than a width W2 of the first opening 29a on the first protrusion structure PA1 in the first direction X.

Referring to FIGS. 1A, 2, 3, 6A, and 6B, the capping insulation layer 24 exposed by the openings 29 may be etched (S20). Openings 32 of the capping insulation layer 24, corresponding to the openings 29 of the mask pattern 28, may be formed by etching the capping insulation layer 24. First to third openings 32a, 32b, and 32c of the capping insulation layer 24, corresponding to the first to third openings 29a, 29b, and 29c of the mask pattern 28, may be formed.

In some embodiments, the planarization stop layer 20 may be exposed by the openings 32 of the capping insulation layer 24. A portion of the protrusion surfaces 24P of the upper surface of the capping insulation layer 24 may remain.

In some embodiments, as the openings 32 of the capping insulation layer 24 is formed, relatively shallow trenches 20t may be formed in an upper portion of the planarization stop layers 20 adjacent to the side walls of the openings 32.

Subsequently, the mask pattern 28 may be removed (S25).

Referring to FIGS. 1A, 2, 3, 7A, and 7B, a first planarization process for first planarizing the capping insulation layer 24 may be performed (S30). The first planarization process may be a chemical mechanical polishing process. The first planarization process may lower the protrusion surfaces 24P of FIG. 6B of the upper surface of the capping insulation layer 24. For example, the first planarization process may lower the protrusion surfaces 24P of the upper surface of the capping insulation layer 24 on a level lower than the recessed surface 24R of FIG. 6B of the upper surface of the capping insulation layer 24.

Referring to FIGS. 1A, 2, 3, 8A, and 8B, a second planarization process for second planarizing the capping insulation layer 24 may be performed (S35). The second planarization process may be a chemical mechanical polishing process. The second planarization process may lower the recessed surface 24R of FIG. 6B of the upper surface of the capping insulation layer 24. For example, the second planarization process may lower the recessed surface 24R of FIG. 6B of the upper surface of the capping insulation layer 24, and remove a portion of the capping insulation layer 24 remaining on the upper surface of the planarization stop layer 20 at the same time. Therefore, the capping insulation layer 24 may be planarized.

The capping insulation layer 24 may have upper end portions 24T adjacent to the protrusion structures PA.

As illustrated in the cross-sectional view of FIG. 8A, in the first direction X, the upper end portions 24T of the capping insulation layer 24 may have a first upper end portion 24T1 and a second upper end portion 24T2, adjacent to a first upper insulation layer 18a of the first protrusion structure PA1, and are opposite to each other, and a third upper end portion 24T3 and a fourth upper end portion 24T4, adjacent to a second upper insulation layer 18b of the second protrusion structure PA2, and are opposite to each other. The second upper end portion 24T2 and the third upper end portion 24T3 may face each other.

In some embodiments, the second upper end portion 24T2 and the third upper end portion 24T3, which may face each other, may be positioned on the same or similar height level with respect to each other.

In some embodiments, the first upper end portion 24T1 may be positioned on a level higher than that of the second upper end portion 24T2. The fourth upper end portion 24T4 may be positioned on a level higher than that of the third upper end portion 24T3. The fourth upper end portion 24T4 may be positioned on a lower level than the first upper end portion 24T1.

Therefore, in the first to fourth upper end portions 24T1, 24T2, 24T3, and 24T4, the first upper end portion 24T1 may be positioned on a relatively high level, the second and third upper end portions 24T2 and 24T3 may be positioned on a relatively low level, and the fourth upper end portion 24T4 may be positioned on a relatively intermediate level.

As illustrated in the cross-sectional view of FIG. 8A, in the second direction Y, the upper end portions 24T of the capping insulation layer 24 may have a fifth upper end portion 24T5 and a sixth upper end portion 24T6, adjacent to the first upper insulation layer 18a of the first protrusion structure PA1, and are opposed to each other, and a seventh upper end portion 24T7 and an eighth upper end portion 24T8, adjacent to a third upper insulation layer 18c of the third protrusion structure PA3, and are opposite to each other. The sixth upper end portion 24T6 and the seventh upper end portion 24T7 may face each other.

In some embodiments, the sixth upper end portion 24T6 and the seventh upper end portion 24T7, which may face each other, may be positioned on the same height level with respect to each other.

In some embodiments, the fifth upper end portion 24T5 may be positioned on a level higher than that of the sixth upper end portion 24T6, the seventh upper end portion 24T7, and the eighth upper end portion 24T8. The eighth upper end portion 24T8 may be positioned on a level higher than that of the seventh upper end portion 24T7.

Therefore, in the fifth to eighth upper end portions 24T5, 24T6, 24T7, and 24T8, the fifth upper end portion 24T5 may be positioned on a relatively high level, the sixth and seventh upper end portions 24T6 and 24T7 may be positioned on a relatively low level, and the eighth upper end portion 24T8 may be positioned on a relatively intermediate level.

In some embodiments, the first and fifth upper end portions 24T1 and 24T5 positioned in different shot areas and facing each other may be positioned on a level higher than that of the other upper end portions 24T2, 24T3, 24T4, 24T6, and 26T7 positioned in any one shot area. The fourth and eighth upper end portions 24T4 and 24T8 facing the other chip regions in any one shot area may be positioned on a lower level than the first and fifth upper end portions 24T1 and 24T5. The sixth and seventh upper end portions 24T6 and 24T7 having a relatively short distance facing each other in any one chip area may be positioned on a lower level than the second and third upper end portions 24T2 and 24T3 having a relatively long distance facing each other.

In some embodiments, the first to fourth upper end portions 24T1, 24T2, 24T3, and 24T4 and the fifth to eighth upper end portions 24T5, 24T6, 24T7, and 24T8 may be positioned on a level higher than that of the upper insulation layer 18, but the present inventive concepts are not limited thereto. At least one upper end portion positioned on a relatively low level among the first to fourth upper end portions 24T1, 24T2, 24T3, and 24T4 and the fifth to eighth upper end portions 24T5, 24T6, 24T7, and 24T8 may be positioned on a lower level than the upper surface of the upper insulation layer 18. Such modified embodiments will be described with reference to FIG. 9. FIG. 9 is a partially enlarged cross-sectional view illustrating some embodiments in which the height level of the second upper end portion 24T2 may vary.

Referring to FIG. 9, the second upper end portion (24T2 in FIG. 8A) positioned on a level higher than that of the upper surface of the upper insulation layer 18 may be modified as a further second upper end portion (24T2' in FIG. 9) positioned on a lower level than the upper surface of the upper insulation layer 18. As described above, positioning at least one upper end positioned on a relatively low level on a lower level than the upper surface of the upper insulation layer 18 may occur by performing an over-planarization process, such that, when the second planarization process may be performed in S35 to second planarize the capping insulation layer 24, the capping insulation layer 24 on the upper surface of the planarization stop layer 20 may not remain, resulting in further second upper end portion 24T2' being on a lower level than the upper surface of the upper insulation layer 18.

Referring to FIGS. 1A, 2, 3, 10A, and 10B, the planarization stop layer 20 of FIG. 8B may be removed (S40). Therefore, the upper insulation layers 18 may be exposed.

A surface of the capping insulation layer 24 may be hardened to form a surface layer 24H. For example, the surface layer 24H may be formed by hardening the surface of the capping insulation layer 24 using an annealing process that may be carried out in a wet atmosphere at a process temperature of about 500° C. to about 1000° C., and for a process time of about 30 minutes to about 2 hours. The surface layer 24H may be seen as a linear shape, when observed using equipment such as a scanning electron microscope or the like.

The surface of the upper insulation layer 18, which may be formed with a more dense oxide than the capping insulation layer 24, may not be hardened by the annealing process, or may be hardened to have a thickness that is thinner than the surface layer 24H of the capping insulation layer 24. In some embodiments, the surface layer 24H of the capping insulation layer 24 may separate the capping insulation layer 24 and the upper insulation layer 18.

The surface layer 24H may be formed by hardening the surface of the capping insulation layer 24, which may be formed of a less dense oxide or a relatively porous oxide, e.g., a low-k dielectric. The surface layer 24H may protect the capping insulation layer 24 from subsequent processes.

Referring to FIG. 1B, a memory structure may then be formed (S45). A method of forming such a memory structure will be described.

Referring to FIGS. 1B, 2, 3, 11A, and 11B, a first insulation layer 36 may be formed on the capping insulation layer 24. Memory vertical structures 40 passing through the central region CR of the protrusion structures PA may be formed on the substrate 10.

Referring to FIGS. 1B, 2, 3, 12A, and 12B, a second insulation layer 56 covering the first insulation layer 36 and the memory vertical structures 40 may be formed. The first and second insulation layers 36 and 56 may be formed of silicon oxide.

Separation trenches 57 passing through the protrusion structures PA may be formed on the substrate 10. The separation trenches 57 may pass through the protrusion structures PA and extend in an upward direction, and may pass through the upper insulation layer 18, the capping insulation layer 24, and the first and second insulation layers 36 and 56, which overlap the protrusion structures PA.

The gate layers 16 may be exposed by the separation trenches 57.

Referring to FIGS. 1B, 2, 3, 13A, and 13B, the gate layers 16 exposed by the separation trenches 57 may be replaced with gate patterns 60. Subsequently, separation structures 66 filling the separation trenches 57 may be formed.

Therefore, the above-described protrusion structures PA may be modified into protrusion structures PA' in which the gate layers 16 are replaced with the gate patterns 60. The protrusion structures PA', which may be modified as above, may include first to third protrusion structures PA1', PA2', and PA3', which may be modified at positions corresponding to the first to third protrusion structures PA1, PA2, and PA3 as described above. Likewise, the molded structures 12 may be replaced by stacked structures 72. Therefore, the stacked structure 72 may include the interlayer insulation layers 14 and the gate patterns 60, which are alternately and repeatedly stacked.

In some embodiments, the gate layers 16 may remain in a portion of the stepped region SR positioned in the width direction of the separation structures 66, e.g., in the second direction Y. Therefore, each of the stacked structures 72 may include the gate layers 16 remaining in a portion of the stepped region SR positioned in the width direction of the separation structures 66, e.g., in the second direction Y, and facing the gate patterns 60.

The plan view of the separation structures 66 will be described with reference to FIG. 14. FIG. 14 is a plan view schematically illustrating the separation structures 66 and the memory vertical structures 40 together with any one of the protrusion structures PA'.

Referring to FIG. 14, the separation structures 66 may traverse the protrusion structure PA'. The memory vertical structures 40 may be formed in the central region CR of the protrusion structure PA', and may be formed between the separation structures 66.

Next, referring to FIGS. 1B, 2, 3, 15A, and 15B, a wiring structure may be formed (S50). Formation of the wiring structure may include forming a third insulation layer 74 on the second insulation layer 56, forming gate contact structures 80 electrically connected to the gate patterns 60 having a stepped structure in the stepped region SR positioned in the first direction X, forming bit line contact structures 82 electrically connected to the memory vertical structures 40, and forming wiring lines 84 and 86 on the third insulation layer 74. The wiring lines 84 and 86 may include gate connection wiring lines 84 electrically connected to the gate contact structures 80, and bit lines 86 electrically connected to the bit line contact structures 82. Then, an upper capping insulation layer 90 covering the wiring lines 84 and 86 may be formed on the third insulation layer 74.

Some embodiments of the above-described methods of forming the memory vertical structures 40, the gate patterns 60, and the separation structures 66 will be described with reference to FIGS. 16 and 17. FIG. 16 is a partially enlarged cross-sectional view illustrating a region including any one of the memory vertical structures 40, and FIG. 17 is a partially enlarged cross-sectional view illustrating a region including any one of the separation structures 66.

Some embodiments of a method of forming any one of the memory vertical structures 40, the gate patterns 60, and any one of the separation structures 66 will be described with reference to FIGS. 11A to 17.

Referring to FIGS. 11A to 17, the memory vertical structure 40 may be formed to include a dielectric structure 44 and a channel semiconductor layer 52. For example, as described in FIGS. 11A and 11B, a formation of the memory vertical structure 40 may include: forming a channel hole passing through the central region CR of the protrusion structure PA and exposing the substrate 10, performing an epitaxial process to form a semiconductor pattern 42 filling a lower region of the channel hole 40H of the substrate 10 exposed by the channel hole 40H, forming a dielectric structure 44 on the side wall of the channel hole 40H, forming a channel semiconductor layer 52 in contact with the semiconductor pattern 42 while covering an inner wall of the dielectric structure 44, forming a core pattern 53 partially filling the channel hole 40H, and forming a pad pattern 54 filling remaining portion of the channel hole 40H. The pad pattern 54 may be formed on the core pattern 53 and in contact with the channel semiconductor layer 52.

The channel semiconductor layer 52 may be formed of polysilicon. The core pattern 53 may be formed of an insulating material such as silicon oxide. The pad pattern 54 may be formed of a doped polysilicon, e.g., polysilicon having N-type conductivity.

The dielectric structure 44 may include a tunnel insulation layer 50, a data storage layer 48, and a blocking insulation layer 46. The data storage layer 48 may be disposed between the tunnel insulation layer 50 and the blocking insulation layer 46. The tunnel insulation layer 50 may be disposed between the channel semiconductor layer 52 and the data storage layer 48. The blocking insulation layer 46 may be disposed between the data storage layer 48 and the gate patterns 60. The tunnel insulation layer 50 may include silicon oxide and/or impurity doped silicon oxide. The blocking insulation layer 46 may include silicon oxide and/or a high-k dielectric.

The data storage layer 48 may store data in a non-volatile memory device such as a flash memory device or the like. For example, the data storage layer 48 may be formed of a material, e.g., silicon nitride, which may trap and retain electrons injected from the channel semiconductor layer 52 through the tunnel insulation layer 50, or erase the trapped electrons in the data storage layer 48, according to operating conditions of a non-volatile memory device such as a flash memory device.

Figure 12A:
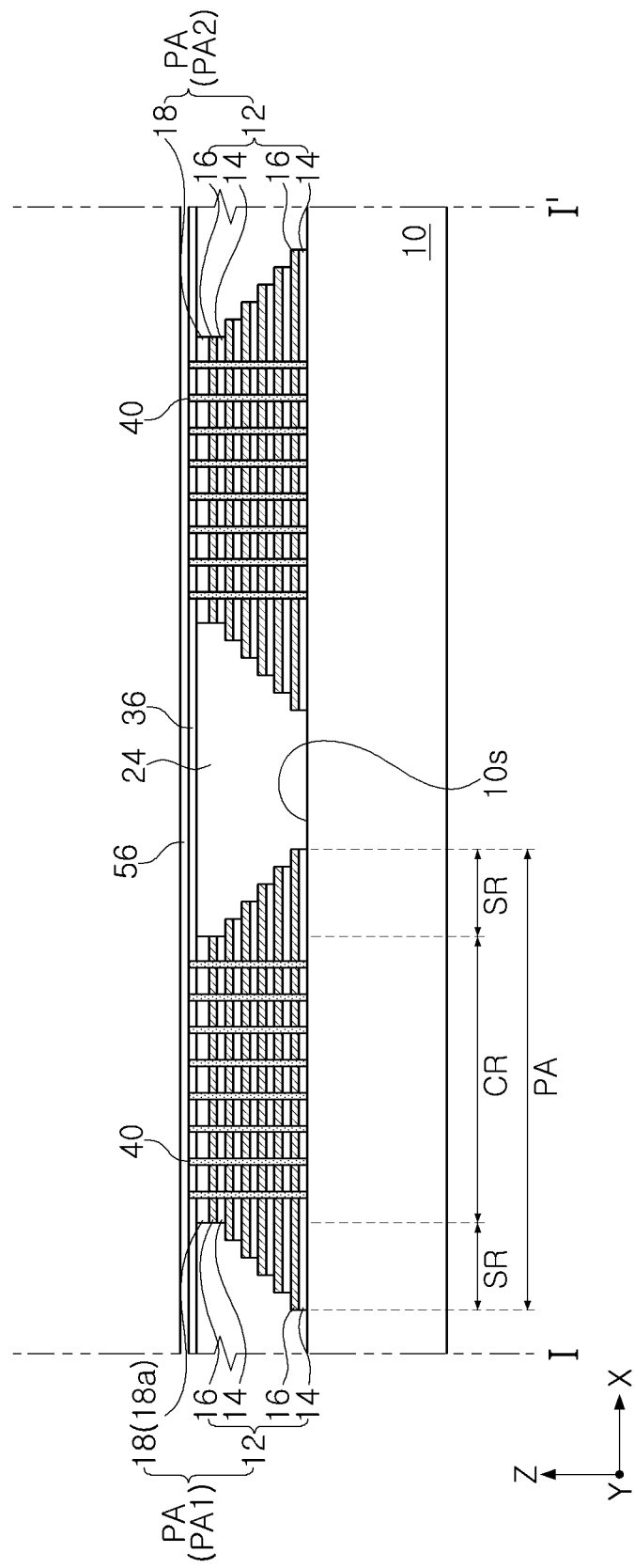
Figure 12B:
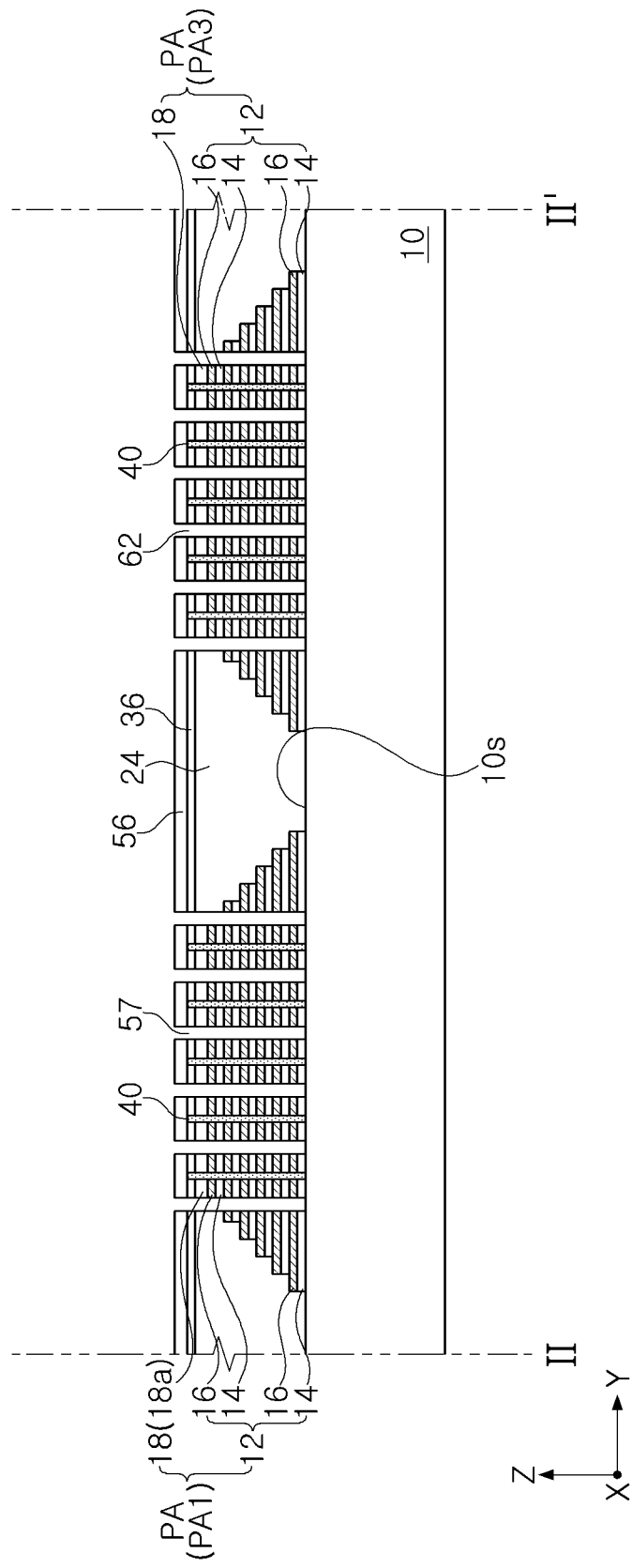
Figure 13A:
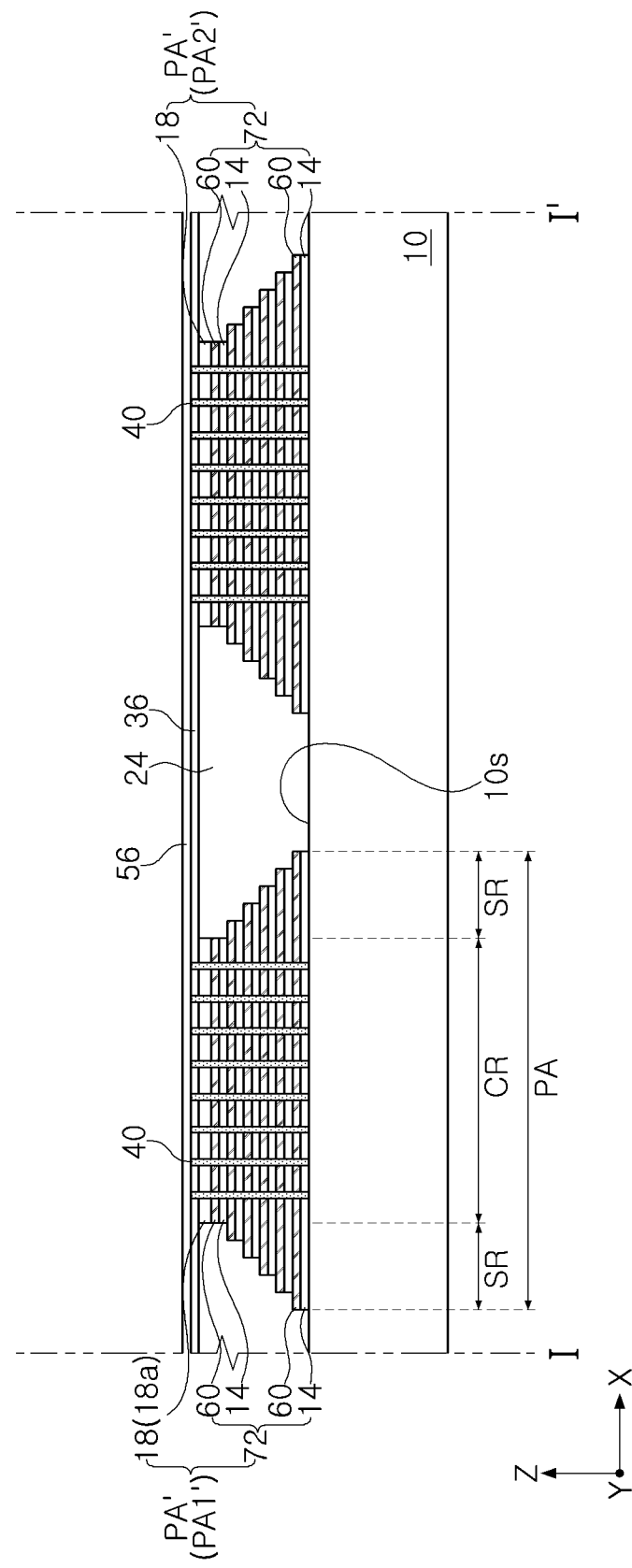
Figure 13B:
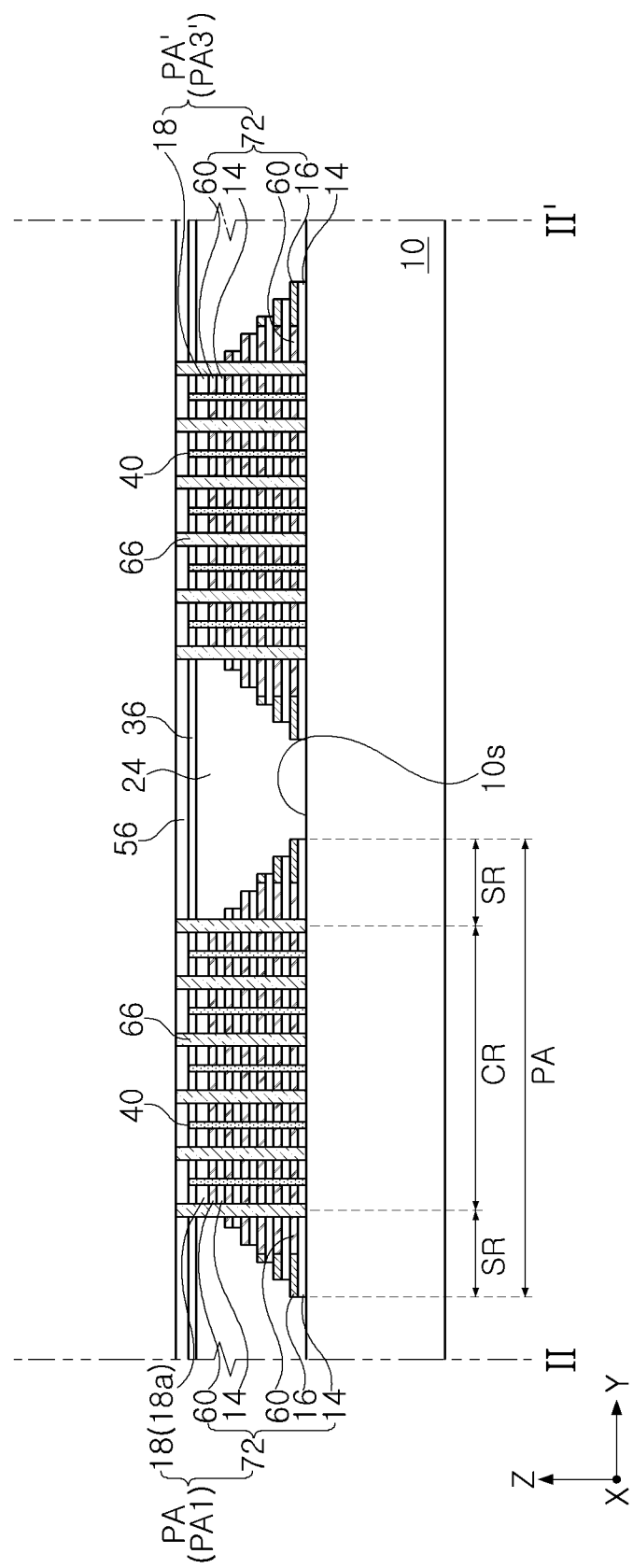

As described in FIGS. 12A and 12B, the formation of the gate patterns 60 may include forming the separation trenches 57 to expose the gate layers (16 in FIGS. 12A and 12B), etching the exposed gate layers (16 in FIGS. 12A and 12B) to form void spaces exposing the side surfaces of the memory vertical structures 40, forming a first material layer 62 covering and/or in contact with the inner walls of the void spaces, and a second material layer 64 filling the void spaces, and removing the first and second material layers 62 and 64 remaining in the separation trenches 57. The first material layer 62 may cover and/or be in contact with upper and lower surfaces of the second material layer 64, and may extend between the second material layer 64 and the memory vertical structure 40.

In some embodiments, the first material layer 62 may be formed of a dielectric, e.g., a high-dielectric such as aluminum oxide, and the second material layer 64 may be formed of a conductive material, e.g., any one of doped polysilicon, a metal nitride (e.g., TiN, or the like), or a metal (e.g., W), or a combination thereof.

In some embodiments, the first material layer 62 and the second material layer 64 may be formed of different conductive materials. For example, the first material layer 62 may be formed of a metal nitride (e.g., TiN), and the second material layer 64 may be formed of a metal (e.g., W).

The gate patterns 60 may include a lower gate pattern 60L, intermediate gate patterns 60M on the lower gate pattern 60L, and an upper gate pattern 60U on the intermediate gate patterns 60M.

In some embodiments, the second material layer 64 of the lower gate pattern 60L may be a ground selection line of a NAND flash memory device, and the second material layers 64 of the intermediate gate patterns 60M may be word lines of a NAND flash memory device, and the second material layer 64 of the upper gate pattern 60U may be a string selection line of a NAND flash memory device.

The data storage layer 48 may store data in a region facing the intermediate gate patterns 60M, which may be word lines. Regions capable of storing data in the data storage layers 48 in the memory vertical structures 40 may be arranged in a direction Z perpendicular to the upper surface of the substrate 10, and may include the memory cells.

The memory vertical structures 40 and the gate patterns 60 may be a memory structure in S45 of FIG. 1B.

After forming the gate patterns 60, the separation structures 66 may be formed to fill the separation trenches (57 in FIGS. 12A and 12B). Each of the separation structures 66 may include separation spacers 68 covering the side surfaces of each of the separation trenches 57 and separation core pattern 70 filling each of the separation trenches 57. In some embodiments, the separation spacer 68 may be formed of an insulating material such as silicon oxide or the like, and the separation core pattern 70 may be formed of any one of a doped polysilicon, a metal nitride (e.g., TiN, etc.), a metal (e.g., W), or a combination thereof.

In some embodiments, the separation spacer 68 and the separation core pattern 70 may be formed of insulating materials.

The second upper end portion 24T2', which may be modified, may be positioned on a lower level than the upper surface of the upper insulation layer 18, as described above with reference to FIG. 9. As described above, a semiconductor process may be performed by the method described with reference to FIGS. 10A to 17 with regard to the substrate having the second upper end portion 24T2', which may be modified, to form a semiconductor device having the second upper end portion 24T2' positioned on a lower level than the upper surface of the upper insulation layer 18 as illustrated in FIG. 18. The third upper end portion 24T3' may be positioned on the same height level as the second upper end portion 24T2' as described above, and, thus, may be positioned on a lower height level than the upper surface of the upper insulation layer 18.

Referring to FIGS. 1B, 2, 3, and 19, a semiconductor chip CH may be separated (S55). The separation of the semiconductor chip CH may include cutting the chip areas CA to separate the chip areas CA from each other, as illustrated in FIG. 2. Each of the chip areas CA thus separated may be the semiconductor chip CH. Therefore, the semiconductor chip CH may include the protrusion structures PA' formed on the substrate 10. Each of the protrusion structures PA' may include a central region CR, and a stepped region SR of a stepped structure surrounding the central region CR.

A product 100 may be formed using the semiconductor chip CH (S60). The product 100 may include the semiconductor chip CH disposed on a base 95. In some embodiments, when the product 100 is a semiconductor device such as a semiconductor package, the base 95 may be a printed circuit board. In another embodiment, the product 100 may be an electronic device comprising a semiconductor device including the semiconductor chip CH.

Therefore, a semiconductor device formed by the method for forming a semiconductor device, as described with reference to FIGS. 1A to 19, may be provided. A structure of the semiconductor device formed by the above-described method will be described with reference to FIGS. 15A, 15B, 16, 17, and 19 again. In explaining the structure of such a semiconductor device, contents overlapping those described above with reference to FIGS. 1A to 19 or the contents capable of being recognized from the contents described with reference to FIGS. 1A to 19 will be omitted.

Referring to FIGS. 14, 15A, 15B, 16, 17 and 19, protrusion structures PA' may be disposed on a substrate 10. Each of the protrusion structures PA' may include a stacked structure 72, and an upper insulation layer 18 on the stacked structure 72.

Each of the protrusion structures PA' may include a central region CR, and a stepped region SR surrounding the central region CR. Each of the stacked structures 72 may be viewed as including the central region CR, and the stepped region SR surrounding the central region CR, in a similar manner to the protrusion structures PA'.

Each of the stacked structures 72 may include interlayer insulation layers 14 and gate patterns 60, which are alternately and repeatedly stacked in the central region CR and extend into the stepped region SR to form a stepped structure in the stepped region SR. The interlayer insulation layers 14 and the gate patterns 60 may have a stepped structure in the stepped regions SR. The upper insulation layer 18 of the protrusion structures PA' may be positioned in the central region CR, and may be disposed on the stacked structures 72.

A capping insulation layer 24 may surround the upper insulation layer 18, cover the stepped regions SR of the stacked structures 72, and fill between the stacked structures 72.

The capping insulation layer 24 may include a surface layer 24H formed in a surface of the capping insulation layer 24. The surface layer 24H may be formed by hardening the surface of the capping insulation layer 24, and, thus, may be harder and/or denser than other portion of the capping insulation layer 24. The other portion of the capping insulation layer 24 may be referred to as a 'main portion'. Accordingly, the surface layer 24H of the capping insulation layer 24 may be disposed on an upper surface of the main portion of the capping insulation layer 24.

The capping insulation layer 24 may include upper end portions 24T adjacent to the upper insulation layer 18 and positioned on different height levels.

The capping insulation layer 24 may include portions increasing in height in a direction Z perpendicular to the upper surface 10s of the substrate 10, as the upper insulation layer 18 are closer to the capping insulation layer 24. For example, the upper end portions 24T of the capping insulation layer 24 may be upper end portions of portions increasing in height in a direction Z perpendicular to the upper surface 10s of the substrate 10, as they are closer to the upper insulation layer 18. For example, the capping insulation layer 24 may include an upper surface 24U, inclined surfaces 24I and the upper end portions 24T. The heights of the upper end portions 24T of the capping insulation layer 24 may be higher than a height relative to the substrate 10 of the upper surface 24U of the capping insulation layer 24. The inclined surfaces 24I of the capping insulating layer 24 may extend from the upper surface 24U of the capping insulation layer 24 to the upper end portions 24T of the capping insulation layer 24.

The stacked structures 72 may include a first stacked structure 72a and a second stacked structure 72b, adjacent to each other in the first direction X. The upper insulation layer 18 may include a first upper insulation layer 18a overlapping the central region CR of the first stacked structure 72a and a second upper insulation layer 18b overlapping the central region CR of the second stacked structure 72b.

The upper end portions 24T of the capping insulation layer 24 may include a first upper end portion 24T1 and a second upper end portion 24T2, adjacent to the first upper insulation layer 18a. The first upper insulation layer 18a may be positioned between the first upper end portion 24T1 and the second upper end portion 24T2.

The second upper end portion 24T2 may be positioned between the first upper insulation layer 18a and the second upper insulation layer 18b, and may be adjacent to the first upper insulation layer 18a. A height level of the second upper end portion 24T2 may be lower than a height level of the first upper end portion 24T1.

The capping insulation layer 24 may further include a third upper end portion 24T3 and a fourth upper end portion 24T4, adjacent to the second upper insulation layer 18b. The second upper insulation layer 18b may be positioned between the third upper end portion 24T3 and the fourth upper end portion 24T4, and the third upper end portion 24T3 may be positioned between the first upper insulation layer 18a and the second upper insulation layer 18b, and may be adjacent to the second upper insulation layer 18b. A height of the third upper end portion 24T3 and a height of the fourth upper end portion 24T4 may be different from each other. The second upper end portion 24T2 and the third upper end portion 24T3 may face each other, and may be positioned on substantially the same height with respect to each other. The fourth upper end portion 24T4 may be positioned on a height that is higher than the second and third upper end portions 24T2 and 24T3, and may be positioned on a lower height than the first upper end portion 24T1.

Memory vertical structures 40 may extend in a vertical direction Z perpendicular to an upper surface 10s of the substrate 10 and have side surfaces facing the gate patterns 60 in the central regions CR of the stacked structures 72 of the protrusion structure PA'. Since the memory vertical structures 40 have been described above in the forming method, a detailed description thereof will be omitted.

Separation structures 66 may extend in a direction Z perpendicular to the upper surface 10s of the substrate 10. The separation structures 66 may pass through the protrusion structures PA'. Each of the protrusion structures PA' located between the separation structures 66 may include the central region CR between the stepped regions SR spaced apart from each other. The stacked structure 72 and the upper insulation layer 18 of the protrusion structure PA' may be positioned between the separation structures 66.

In some embodiments, the upper end portions 24T may be positioned on a level higher than that of the upper surface of the upper insulation layer 18, but the present inventive concepts are not limited thereto. Referring to FIG. 18, one of the upper end portions 24T may be positioned on a level higher than that of the upper surface of the upper insulation layer 18, and the other may be positioned on a lower level than the upper surface of the upper insulation layer 18. In the upper end portions 24T, the second and third upper end portions 24T2 and 24T3 may be positioned on a lower level than the upper surface of the upper insulation layer 18, and the first and fourth end portions 24T1 and 24T4 may be positioned on a level higher than that of the upper surface of the upper insulation layer 18.

The degree of planarization of the capping insulation layer 24 may be improved by planarization of the capping insulation layer 24 using the methods described above. For example, in the capping insulation layer 24, the degree of planarization in a portion apart from the protrusion structures PA may be improved. Therefore, the overall degree of planarization of the planarized capping insulation layer 24 may be improved. A subsequent photolithography process using a substrate including the capping insulation layer 24 to improve the degree of planarization, e.g., a photolithography process for forming the channel holes filled in the memory vertical structures 40 (40H in FIG. 16) or a photolithography process for forming the separation trenches 57 may proceed without defects or with minimal defects.

As described above, since the degree of planarization of the capping insulation layer 24 may be improved, the number of stacked gate patterns 60 in the protrusion structure PA' may be increased to improve the degree of integration of semiconductor devices. For example, even when a height difference between an upper surface and a lower surface of the protrusion structure PA' is increased by increasing the number of stacked gate patterns 60 in the protrusion structure PA', semiconductor devices minimized defects may be formed by providing a method of planarizing the capping insulation layer 24. Therefore, the degree of integration of semiconductor devices, yield, and productivity in the manufacturing of semiconductor devices may be improved.

According to some embodiments of the present inventive concepts, a method of forming semiconductor devices may improve the degree of planarization of a capping insulation layer filling between stacked structures. When the method is used, the degree of integration of semiconductor devices may be improved, and productivity in the manufacturing of semiconductor devices may be improved.

While example embodiments have been shown and described above, it will be apparent to those skilled in the art that modifications and variations could be made without departing from the scope of the present inventive concepts as defined by the appended claims.

What is claimed is:
1. A method for forming a semiconductor device comprising:
   forming protrusion structures on a substrate, wherein each of the protrusion structures comprises a molded structure, an upper insulation layer on the molded structure, and a planarization stop layer on the upper insulation layer;
   forming a capping insulation layer on the substrate having the protrusion structures;
   forming a mask pattern having openings on the capping insulation layer, wherein the openings overlap the protrusion structures;
   etching the capping insulation layer exposed by the openings;
   removing the mask pattern after etching the capping insulation layer;
   performing a first planarization process for first planarizing the capping insulation layer, after the mask pattern is removed;
   performing a second planarization process for second planarizing the capping insulation layer to form a planarized capping insulation layer, after the first planarization process; and
   removing the planarization stop layers of the protrusion structures to expose the upper insulation layers,
   wherein the planarized capping insulation layer has upper end portions adjacent to the planarization stop layers, and
   wherein the upper end portions comprise first and second upper end portions positioned at different height levels.
2. The method according to claim 1,
   wherein the planarized capping insulation layer comprises protrusion regions of increasing height protruding in a direction perpendicular to an upper surface of the substrate as the planarized capping insulation layer is closer to the upper insulation layers, and
   wherein the upper end portions of the planarized capping insulation layer are upper end portions of the protrusion regions.

3. The method according to claim 1, further comprising:
hardening a surface of the planarized capping insulation layer to form a surface layer within a surface of the planarized capping insulation layer.

4. The method according to claim 1, further comprising:
forming memory vertical structures passing through the upper insulation layer and the molded structures,
wherein each of the molded structures of the protrusion structures comprises interlayer insulation layers and gate layers that are alternately and repeatedly stacked, and
wherein the memory vertical structures have side surfaces facing the gate layers.

5. The method according to claim 4, further comprising:
forming separation trenches that pass through the protrusion structures and exposing the gate layers;
replacing the gate layers exposed by the separation trenches with gate patterns; and
forming separation structures within the separation trenches.

6. A method for forming a semiconductor device comprising:
forming protrusion structures on a substrate, wherein each of the protrusion structures comprises a molded structure comprising a central region and a stepped region surrounding the central region, an upper insulation layer on the central region of the molded structure, and a planarization stop layer on the upper insulation layer;
forming a capping insulation layer on the substrate having the protrusion structures;
forming a mask pattern having openings on the capping insulation layer, wherein the openings overlap the central regions of the protrusion structures;
etching the capping insulation layer exposed by the openings;
removing the mask pattern after etching the capping insulation layer;
performing a first planarization process for first planarizing the capping insulation layer, after the mask pattern is removed;
performing a second planarization process for second planarizing the capping insulation layer to form a planarized capping insulation layer, after the first planarization process; and
removing the planarization stop layers of the protrusion structures to expose the upper insulation layers, wherein the openings have a smaller size than the planarization stop layers of the protrusion structures, and
wherein the openings comprise openings having different widths or sizes from each other.

7. The method according to claim 6,
wherein in one first protrusion structure among the protrusion structures, and in a first opening on the planarization stop layer of the first protrusion structure among the openings, the planarization stop layer of the first protrusion structure has a first side surface and a second side surface,
wherein the first opening has a first side wall adjacent to the first side surface and a second side wall adjacent the second side surface, and
wherein a distance between a conceptual line extending from the first side surface of the planarization stop layer in an upward direction and the first side wall of the first opening is different from a distance between a conceptual line extending from the second side surface of the planarization stop layer in an upward direction and the second side wall of the first opening.

8. The method according to claim 7, wherein, in the first protrusion structure, a distance between the conceptual line extending from the first side surface of the planarization stop layer in the upward direction and the first side wall of the first opening is shorter than a distance between the conceptual line extending from the second side surface of the planarization stop layer in the upward direction and the second side wall of the first opening.

9. The method according to claim 8, wherein the protrusion structures comprise a second protrusion structure facing the first side surface of the first protrusion structure and spaced apart from the first protrusion structure by a first distance, and a third protrusion structure facing the second side of the first protrusion structure and spaced apart from the first protrusion structure by a second distance shorter than the first distance.

10. The method according to claim 6, wherein distances between side walls of the openings and conceptual lines extending from side surfaces of the planarization stop layer in an upward direction are determined according to a distance between neighboring protrusion structures.

11. The method according to claim 6, further comprising:
hardening a surface of the planarized capping insulation layer to form a surface layer within the surface of the planarized capping insulation layer.

12. The method according to claim 6, further comprising:
forming memory vertical structures passing through the upper insulation layer and the molded structures,
wherein each of the molded structures of the protrusion structures comprises interlayer insulation layers and gate layers which are alternately and repeatedly stacked, and
wherein the memory vertical structures have side surfaces facing the gate layers.

13. The method according to claim 12, further comprising:
forming separation trenches passing through the protrusion structures and exposing the gate layers;
replacing the gate layers exposed by the separation trenches with gate patterns; and
forming separation structures within the separation trenches.

14. A method for forming a semiconductor device comprising:
forming first and second protrusion structures on a substrate, wherein the first protrusion structure comprises a first molded structure comprising a first central region and a first stepped region adjacent to the first central region, a first upper insulation layer on the first central region, and a first planarization stop layer on the first upper insulation layer, and wherein the second protrusion structure comprises a second molded structure comprising a second central region and a second stepped region adjacent to the second central region, a second upper insulation layer on the second central region, and a second planarization stop layer on the second upper insulation layer;
forming a capping insulation layer on the substrate having the first and second protrusion structures, wherein the capping insulation layer overlaps the first and second planarization stop layers;

forming a mask pattern having first and second openings on the capping insulation layer, wherein the first opening overlap the first central region of the first protrusion structure, and wherein the second opening overlap the second central region of the second protrusion structure;

etching the capping insulation layer exposed by the first and second openings of the mask pattern;

removing the mask pattern after etching the capping insulation layer; and performing a planarization process for planarizing the capping insulation layer after the mask pattern is removed, wherein a width of the first opening is different from a width of the second opening.

15. The method according to claim 14, wherein a size of the first protrusion structure is substantially the same as a size of the second protrusion structure.

16. The method according to claim 14, wherein a width of the first planarization stop layer is greater than a width of the first opening, and wherein a width of the second planarization stop layer is greater than a width of the second opening.

17. The method according to claim 14, further comprising:

hardening a surface of the planarized capping insulation layer to form a surface layer within the surface of the planarized capping insulation layer.

18. The method according to claim 14, further comprising:

forming memory vertical structures, wherein each of the first and second molded structures comprise interlayer insulation layers and gate layers, which are alternately and repeatedly stacked, and wherein the memory vertical structures comprise a first memory vertical structure passing through the first upper insulation layer and the first molded structures, and a second memory vertical structure passing through the second upper insulation layer and the second molded structure.

19. The method according to claim 18, further comprising:

forming separation trenches, wherein the separation trenches comprise a first separation trench passing through the first protrusion structure and exposing the gate layers of the first protrusion structure, and a second separation trench passing through the second protrusion structure and exposing the gate layers of the second protrusion structure;

replacing the gate layers exposed by the separation trenches with gate patterns; and forming a first separation structure within the first separation trench and a second separation structure within the second separation trench.

20. The method according to claim 19, further comprising:

forming gate contact plugs passing through the planarized capping insulation layer and contacting gate pads of the gate patterns in the first and second stepped regions.

* * * * *